US012671424B2

(12) United States Patent     (10) Patent No.:   US 12,671,424 B2

Hong                (45) Date of Patent:     Jun. 30, 2026

(54) ERROR DETECTORS AND MEMORY DEVICES HAVING ERROR DETECTORS THEREIN, AND METHODS OF PERFORMING ERROR DETECTION

(71) Applicant: Samsung Electronics Co., Ltd., Suwon-si (KR)

(72) Inventor: Seunghwan Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/636,706

(22) Filed: Apr. 16, 2024

(65) Prior Publication Data

US 2025/0096806 A1     Mar. 20, 2025

(30) Foreign Application Priority Data

Sep. 20, 2023    (KR) ........................ 10-2023-0125789

(51) Int. Cl.
| | |
|---|---|
| *H03L 7/097* | (2006.01) |
| *H03L 7/081* | (2006.01) |
| *H03L 7/093* | (2006.01) |

(52) U.S. Cl.
CPC ............ *H03L 7/097* (2013.01); *H03L 7/0818* (2013.01); *H03L 7/093* (2013.01)

(58) Field of Classification Search
None
See application file for complete search history.

(56) References Cited

U.S. PATENT DOCUMENTS

| | | | |
|---|---|---|---|
| 7,532,682 B1 | 5/2009 | Schell | |
| 7,545,188 B1 * | 6/2009 | Xu | H03D 7/1458 |
| | | | 327/148 |
| 8,665,014 B2 * | 3/2014 | Chiu | H04L 27/38 |
| | | | 329/345 |
| 9,602,082 B2 | 3/2017 | Hedayati et al. | |

(Continued)

FOREIGN PATENT DOCUMENTS

| | | |
|---|---|---|
| KR | 20220144481 A | 10/2022 |
| KR | 20230052554 A | 4/2023 |

OTHER PUBLICATIONS

J.-H. Chae, H. Ko, J. Park and S. Kim, "A Quadrature Clock Corrector for DRAM Interfaces, With a Duty-Cycle and Quadrature Phase Detector Based on a Relaxation Oscillator," in IEEE Transactions on Very Large Scale Integration (VLSI) Systems, vol. 27, No. 4, pp. 978-982, Apr. 2019, (Year: 2019).*

*Primary Examiner* — Daniel F. McMahon
(74) *Attorney, Agent, or Firm* — Wolf, Greenfield & Sacks, P.C.

(57)          ABSTRACT

An error detector includes a first pulse generator configured to generate first and second interval signals in response to a plurality of phase signals, a first low-pass filter configured to convert the first and second interval signals into respective first and second voltages, and a first comparator configured to determine an error in a first phase signal among the plurality of phase signals, in response to the first and second voltages. The first pulse generator may be configured to generate the first interval signal in response to the first phase signal and a second phase signal among the plurality of phase signals, and generate the second interval signal in response to the first phase signal and a third phase signal among the plurality of phase signals.

20 Claims, 18 Drawing Sheets

(56) References Cited

U.S. PATENT DOCUMENTS

| | | | |
|---|---|---|---|
| 9,654,133 B2 | 5/2017 | Speir et al. | |
| 10,963,002 B1 * | 3/2021 | Hafizi | G06F 1/10 |
| 11,121,716 B2 * | 9/2021 | Shin | G06F 1/06 |
| 11,258,436 B1 * | 2/2022 | Lin | H03K 5/01 |
| 11,742,016 B2 | 8/2023 | Yoon et al. | |
| 11,791,811 B2 | 10/2023 | Rie et al. | |
| 2002/0084818 A1 * | 7/2002 | Cho | H03K 5/1565 |
| | | | 327/175 |
| 2012/0183104 A1 * | 7/2012 | Hong | H03L 7/085 |
| | | | 375/340 |
| 2016/0182074 A1 | 6/2016 | Speir et al. | |
| 2017/0033774 A1 | 2/2017 | Hedayati et al. | |
| 2018/0175843 A1 * | 6/2018 | Lee | H03K 5/15033 |
| 2022/0336004 A1 | 10/2022 | Yoon et al. | |
| 2023/0107825 A1 | 4/2023 | Chen | |
| 2023/0110301 A1 | 4/2023 | Rie et al. | |
| 2024/0162921 A1 * | 5/2024 | Chakraborty | H04B 1/0028 |
| 2024/0219953 A1 * | 7/2024 | Choi | G06F 1/08 |

* cited by examiner

ERROR DETECTORS AND MEMORY DEVICES HAVING ERROR DETECTORS THEREIN, AND METHODS OF PERFORMING ERROR DETECTION

REFERENCE TO PRIORITY APPLICATION

This application claims priority to Korean Patent Application No. 10-2023-0125789, filed Sep. 20, 2023, the disclosure of which is hereby incorporated herein by reference.

BACKGROUND

The present disclosure relates to error detectors and methods of performing error detection, and memory devices using error detection.

The technology that modulates the phase difference of a plurality of clock signals with pulse width to generate a pulse signal in a semiconductor device is used. In order to generate a pulse signal based on the phase difference of the clock signal, a clock signal having multiple phases may be generated, and a pulse signal may be generated by applying predetermined logic to adjacent clocks.

SUMMARY

The present disclosure attempts to provide an error detector capable of generating a pulse signal based on a multi-phase signal and detecting an error in the multi-phase signal based on the pulse signal, a memory device, and an error detecting method.

An error detector according to an embodiment includes: a first pulse generator configured to generate a first interval signal and a second interval signal having an interval substantially the same as the first interval signal, based on a plurality of phase signals; a first low-pass filter configured to convert the first interval signal to a first voltage and converting the second interval signal to a second voltage; and a first comparator for determining an error in a first phase signal corresponding to the first interval signal and the second interval signal among the plurality of phase signals, based on the first voltage and the second voltage.

A memory device according to an embodiment includes: a first error detector configured to generate a first interval signal and a second interval signal having a first interval based on a first quadrature clock signal, and detecting a first error in a first inverted in-phase signal of the first quadrature clock signal based on the first interval signal and the second interval signal; a second error detector configured to generate a third interval signal and a fourth interval signal having a second interval based on the first quadrature clock signal, and detecting a second error in a first quadrature signal of the first quadrature clock signal based on the third interval signal and the fourth interval signal; a third error detector configured to generate a fifth interval signal and a sixth interval signal having a third interval based on the first quadrature clock signal, and detecting a third error in a first inverted quadrature signal of the first quadrature clock signal based on the fifth interval signal and the sixth interval signal; a delay cell for generating a second inverted in-phase signal by delaying the first inverted in-phase signal based on the first error, generating a second quadrature signal by delaying the first quadrature signal based on the second error, and generating a second inverted quadrature signal by delaying the first inverted quadrature signal based on the third error; and a memory chip configured to perform a memory operation based on a first in-phase signal among the second inverted in-phase signal, the second quadrature signal, the second inverted quadrature signal, and the first quadrature clock signal.

An error detecting method according to an embodiment includes: receiving a plurality of phase signals, generating a plurality of interval signals based on the plurality of phase signals, and determining an error in any one of the plurality of phase signals based on a first interval signal and a second interval signal having the same interval among the plurality of interval signals.

BRIEF DESCRIPTION OF THE DRAWINGS

FIG. 12 is a block diagram for describing a quadrature error corrector according to an embodiment.

FIG. 13 illustrates a circuit diagram of a pulse generator according to an embodiment.

FIG. 17 is a diagram illustrating a memory module according to an embodiment.

DETAILED DESCRIPTION OF EMBODIMENTS

Figure 1:
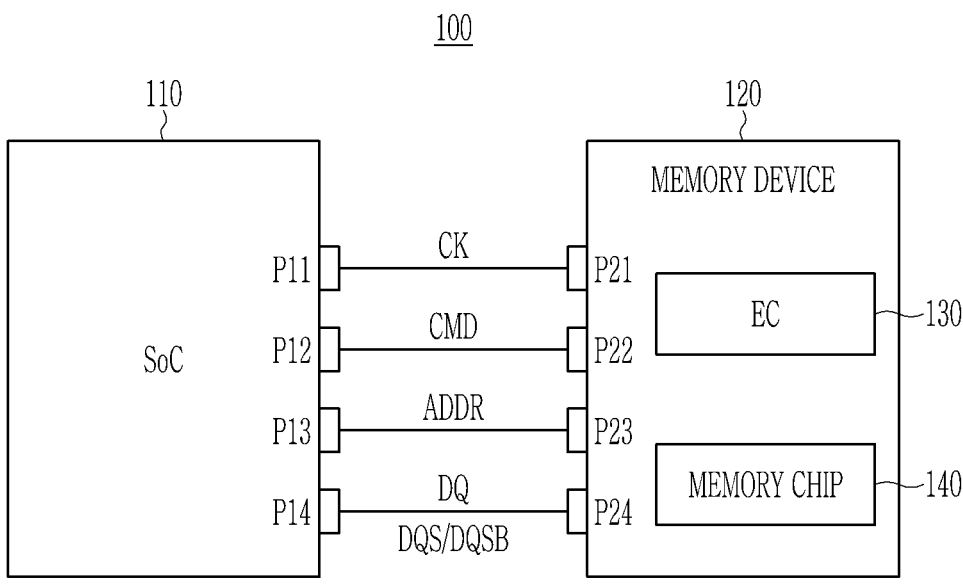
FIG. 1 is a schematic block diagram of a semiconductor device according to an embodiment.

Hereinafter, the present disclosure will be described in detail hereinafter with reference to the accompanying drawings, in which embodiments of the present disclosure are shown. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification. In the flowchart described with reference to drawings in this description, the operation order may be changed, several operations may be merged, certain operations may be divided, and specific operations may not be performed.

Furthermore, expressions described in the singular in this specification may be interpreted as the singular or plural unless an explicit expression such as "one" or "single" is used. Although terms of "first," "second," and the like are used to explain various constituent elements, the constituent elements are not limited to such terms. These terms are only used to distinguish one constituent element from another constituent element.

FIG. 1 is a schematic block diagram of a semiconductor device 100 according to an embodiment, which includes a system on chip (SoC) 110 and a memory device 120. As shown, the SoC 110 may be electrically connected to a memory device 120. In some embodiments, the SoC 110 and the memory device 120 may be connected through a memory interface and exchange signals through the memory interface. The SoC 110 may include a processor controlling the memory device 120. For example, the processor may be a central processing unit (CPU), graphic processing unit (GPU), neural processing unit (NPU), a microprocessor, or an application processor (AP).

The memory device 120 may be a storage device based on a semiconductor device. The memory device 120 may be implemented as volatile or non-volatile memory. For example, the memory device 120 may include a dynamic random access memory (DRAM) device, a static random access memory (SRAM) device, a thyristor random access memory (TRAM) device, a NAND flash memory device, a NOR flash memory device, a resistive random access memory (RRAM) device, a ferroelectric random access memory (FRAM) device, a phase change random access Memory (PRAM) device, a magnetic random access memory (MRAM) device, a solid state drive (SSD) device, a memory card (memory card), an universal flash storage (UFS), and the like. The memory device 120 may be a component device other than a storage device.

In an embodiment, a clock pin P11, a command pin P12, an address pin P13, and a data pin P14 of the SoC 110 may be electrically connected to a clock pin P21, a command pin P22, an address pin P23, and a data pin P24 of the memory device 120, respectively. However, the embodiment is not necessarily limited thereto, and depending on the embodiment, the SoC 110 and the memory device 120 may be connected in various ways to exchange signals.

The SoC 110 may generate a command signal CMD, an address ADDR, and a system clock signal CK, and the like. The SoC 110 may provide the system clock signal CK to the memory device 120 through the clock pins P11 and P21, provide the command signal CK to the memory device 120 through the command pins P12 and P22, and provide the address ADDR to the memory device 120 through the address pins P13 and P23. In addition, the SoC 110 may receive a data input/output signal DQ, a data strobe signal DQS, and an inverted data strobe signal DQSB from the memory device 120 through the data pins P14 and P24, or transmit the processing result of data to the memory device 120. DQS may be used for sampling the DQ.

The SoC 110 provides signals to the memory device 120 to control the memory operation of the memory device 120. The signal may include the command signal CMD and the address ADDR. In some embodiments, the SoC 110 may provide the command signal CMD and the address ADDR to the memory device 120 to access a memory chip 140 and control memory operations such as read or write. The memory chip 140 may include a plurality of memory cell arrays. DQ and DQS may be transferred from the memory chip 140 to the SoC 110 according to a read operation, and DQ and DQS may be transferred from the SoC 110 to the memory chip 140 according to a write operation. Since DQ and DQS are bidirectional signals, DQ and DQS output from the SoC 110 to the memory device 120 may be referred to as write DQ and write DQS, respectively, and DQ and DQS output from the memory device 120 to the SoC 110 may be referred to as read DQ and read DQS, respectively.

The command signal CMD may include an activate instruction, a read/write instruction, a refresh instruction, and the like. In some embodiments, the command signal CMD may further include a precharge instruction. The activate instruction may be an instruction that switches the target row of the memory chip 140 to an active state in order to write data to the memory chip 140 or read data from the memory chip 140. Memory cells in the target row may be activated (e.g., driven) in response to the activate instruction. The read/write instruction may be an instruction to perform a read or write operation on the target memory cell of the row that has been switched to the active state. The refresh instruction may be an instruction for performing a refresh operation in the memory chip 140.

The SoC 110 applies the system clock signal CK to the memory device 120 to control data input/output, among other operations. The system clock signal CK may be provided in the form of differential signals having complementary phases. For example, the system clock signal CK may include two signals in half-rate phase. In some embodiments, the system clock signal CK may include signals in quarter-rate phase (i.e., quadrature clock signal). In some embodiments, the system clock signal CK may include multi-phase signals. As will be understood by those skilled in the art, the system clock signal CK may be a clock related to the transfer rate of the command signal CMD or address ADDR applied to perform data input/output operations. In some embodiments, command CMD and address signals ADDR are transmitted based on a system clock signal. In an embodiment, the SoC 110 may apply a data clock signal related to the input/output rates of DQ and DQS to the memory device 120. At this time, the data clock signal may also be provided in the form of differential signals having complementary phases. DQ and DQS may be transmitted based on a data clock signal.

The memory device 120 may include an error corrector (EC) 130 and the memory chip 140. The EC 130 may include an error detector detecting an error in the system clock signal CK. The EC 130 may correct errors detected by the error detector. For example, the EC 130 may adjust at least one of duty ratio or phase. In some embodiments, the error detector may be disposed external to the EC 130.

The EC 130 may be a quadrature error corrector (QEC). That is, the EC 130 may detect and correct errors of the system clock signal CK and output an error-corrected quadrature clock signal. The QEC may include a quadrature error detector (QED) detecting errors in the system clock signal CK.

In an embodiment, the EC 130 may receive a half-rate clock signal. The EC 130 may generate a quadrature clock signal from a half-rate clock signal. The EC 130 may detect errors in the quadrature clock signal and correct the errors. In another embodiment, the EC 130 may receive a quadrature clock signal. The EC 130 may detect errors in the quadrature clock signal and correct the errors. The EC 130 may output the error-corrected quadrature clock signal. The error-corrected quadrature clock signal may be used to operate the memory chip 140. In the above, it has been described that the EC 130 is configured to detect and correct errors in the quadrature clock signal, but the embodiment is not necessarily limited thereto, and the EC 130 may also detect and correct errors in multi-phase signals.

Figure 2:
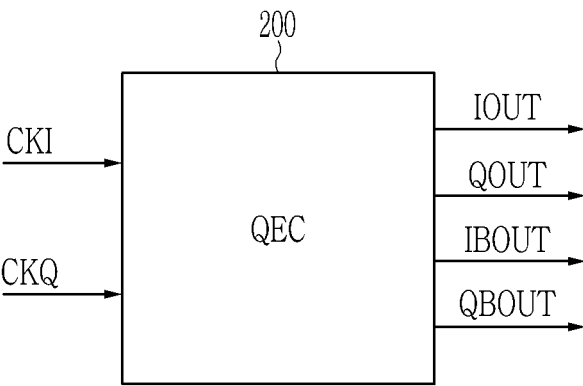
FIG. 2 is a diagram for describing the operation of an error corrector according to an embodiment.
Figure 3:
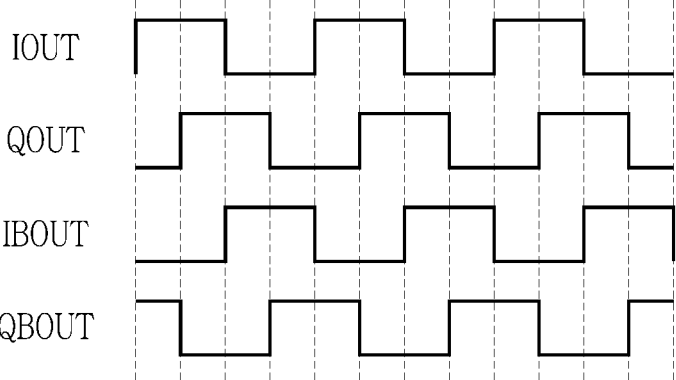
FIG. 3 is a diagram for describing a second quadrature clock signal generated by an error corrector according to an embodiment.

FIG. 2 is a diagram for describing the operation of an error corrector according to an embodiment, and FIG. 3 is a diagram for describing a second quadrature clock signal generated by an error corrector according to an embodiment. Referring to FIG. 2, an error corrector 200 according to an embodiment may be a quadrature error corrector. The error corrector 200 may receive half-rate clock signals CKI and CKQ. For example, the SoC 110 of FIG. 1 may provide the half-rate clock signals CKI and CKQ to the memory device 120. As another example, the SoC 110 may provide a full-rate clock signal oscillating at a predetermined period to the memory device 120, and the memory device 120 may generate the half-rate clock signals CKI and CKQ based on the full-rate clock signal of the SoC 110.

The error corrector 200 may generate a first quadrature clock signal based on the half-rate clock signals CKI and CKQ. The first quadrature clock signal may include errors such as skew. The memory device 120 may not be able to maintain the phase difference between clock signals (IOUT, QOUT, IBOUT, and QBOUT) at π/2 (i.e., 90 degrees) due to various internal noises, and so the error corrector 200 may detect an error in the first quadrature clock signal and correct the error.

In some embodiments, the error corrector 200 may receive the first quadrature clock signal from the memory device 120, which may generate the first quadrature clock signal based on the clock signal of the SoC 110. In addition, the error corrector 200 may generate a plurality of interval signals based on the first quadrature clock signal. The plurality of interval signals may be edge-triggered signals generated based on the edges of the first quadrature clock signal. The error corrector 200 may detect an error in the first quadrature clock signal based on two interval signals from among the plurality of interval signals. The configuration in which the error corrector 200 generates a plurality of interval signals will be described later with reference to FIG. 4.

The error corrector 200 may correct errors by adjusting at least one of the duty ratio or phase of the first quadrature clock signal. The error corrector 200 may correct errors so that the phase difference of the first quadrature clock signal is π/2. The error corrector 200 may correct errors in the first quadrature clock signal to generate and output second quadrature clock signals (IOUT, QOUT, IBOUT, and QBOUT).

Referring to FIG. 3, the second quadrature clock signals (IOUT, QOUT, IBOUT, and QBOUT) may have a phase difference of π/2. For example, the rising edge of the first clock signal (IOUT; Phase I (in-phase)) and the second clock signal (QOUT; Phase Q (quadrature phase)) have a phase difference of π/2, the rising edge of the second clock signal (QOUT) and the third clock signal (IBOUT; Phase IB (inverted in-phase)) have a phase difference of π/2, and the rising edge of the third clock signal (IBOUT) and the fourth clock signal (QBOUT; Phase QB (inverted quadrature phase)) has a phase difference of π/2. Likewise, falling edges of the second quadrature clock signals (IOUT, QOUT, IBOUT, and QBOUT) may also have a phase difference of π/2.

Figure 4:
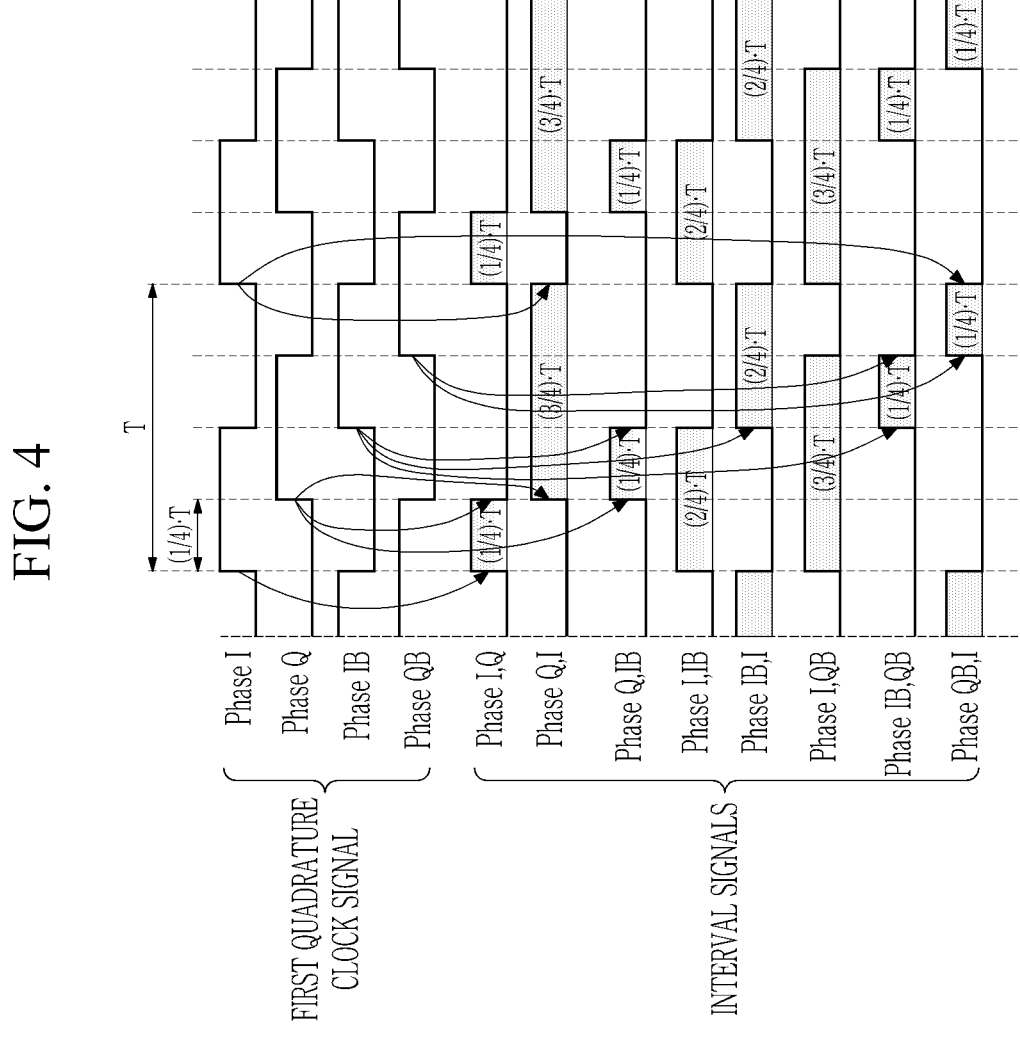
FIG. 4 is a diagram for describing a plurality of interval signals generated by an error corrector according to an embodiment.

FIG. 4 is a diagram for describing a plurality of interval signals generated by an error corrector according to an embodiment. Referring to FIG. 4, the first quadrature clock signal may include an in-phase signal Phase I, a quadrature signal Phase Q, an inverted in-phase signal Phase IB, and an inverted quadrature signal Phase QB. The period of the first quadrature clock signal is T. At least one of the quadrature signal Phase Q, the inverted in-phase signal Phase IB, or the inverted quadrature signal Phase QB may include an error based on the in-phase signal Phase I. The error corrector may detect and correct at least one error among the quadrature signal Phase Q, the inverted in-phase signal Phase IB, and the inverted quadrature signal Phase QB.

An error corrector may generate a plurality of interval signals based on the first quadrature clock signal. The plurality of interval signals may include first to eighth edge-triggered signals. The error corrector may generate a first edge trigger signal Phase I,Q having a first period (1/4)*T from the edge of the in-phase signal Phase I to the edge of the quadrature signal Phase Q. For example, the first edge trigger signal Phase I,Q may be at high for the first period (1/4)*T from a rising edge of the in-phase signal Phase I to a first rising edge of the quadrature signal Phase Q. In addition, the error corrector may generate a second edge trigger signal Phase Q,I having a second period (3/4)*T from the edge of the quadrature signal Phase Q to the edge of the in-phase signal Phase I. For example, the second edge trigger signal Phase Q,I may be at high for the second period (3/4)*T from a rising edge of the quadrature signal Phase Q to a second rising edge of the in-phase signal Phase I. However, the one or more embodiments of the disclosure are not limited thereto, and the error corrector may be configured such that respective falling edges are used to generate the plurality of interval signals.

An error corrector may detect and correct the error in the quadrature signal Phase Q based on the first edge trigger signal Phase I,Q and the second edge trigger signal Phase Q, I. However, since the first period (1/4)*T and the second period (3/4)*T are different, the error corrector needs to match the first period and the second period using a level shifter. For example, the level shifter may adjust the first period (1/4)*T and the second period (3/4)*T to values corresponding to the period (2/4)*T. However, there may an issue where different sizes of distortion occurred in the first period (1/4)*T and the second period (3/4)*T due to PVT (Process, Voltage, Temperature) variations. Additionally, there may be an issue where distortion occurred due to a mismatch between the resistance of the level shifter and the resistance of the low pass filter (LPF).

Accordingly, the error corrector according to an embodiment may generate a third edge trigger signal Phase Q,IB having a third period (1/4)*T from the edge of the quadrature signal Phase Q to the edge of the inverted in-phase signal Phase IB. The error corrector may detect and correct errors in the quadrature signal Phase Q based on the first edge trigger signal Phase I,Q and the third edge trigger signal Phase Q,IB. Since the first period (1/4)*T and the third period (1/4)*T are the same, the level shifter may not be used (or omitted) such that the speed of the error corrector may be improved and the size of the error corrector may be reduced. Additionally, distortion due to mismatch between the resistance of the level shifter and the resistance of the low-pass filter may be prevented.

The error corrector may generate a fourth edge trigger signal Phase I,IB having a fourth period (2/4)*T from the edge of the in-phase signal Phase I to the edge of the inverted in-phase signal Phase IB. In addition, the error corrector may generate a fifth edge trigger signal Phase IB,I having a fifth period (2/4)*T from the edge of the inverted in-phase signal Phase IB to the edge of the in-phase signal Phase I. The error corrector may detect and correct errors in the inverted in-phase signal Phase IB based on the fourth edge trigger signal Phase I,IB and the fifth edge trigger signal Phase IB,I.

In addition, the error corrector may generate a sixth edge trigger signal Phase I,QB with a sixth period (3/4)*T from the edge of the in-phase signal Phase I to the edge of the inverted quadrature signal Phase QB, generate a seventh edge trigger signal Phase IB,QB having a seventh period (1/4)*T from the edge of the inverted in-phase signal Phase IB to the edge of the inverted quadrature signal Phase QB, and generate an eighth edge trigger signal Phase QB,I having an eighth period (1/4)*T from the edge of the inverted quadrature signal Phase QB to the edge of the in-phase signal Phase I.

An error corrector may detect and correct the error in the inverted quadrature signal Phase QB based on the sixth edge trigger signal Phase I,QB and the eighth trigger signal Phase QB, I. However, since the sixth period (3/4)*T and the eighth period (1/4)*T are different, the error corrector had to match the periods using a level shifter. In this case, there may be an issue where different sizes of distortion occurred in the sixth period (3/4)*T and the eighth period (1/4)*T due to PVT variations. Additionally, there may be an issue where distortion occurred due to a mismatch between the resistance of the level shifter and the resistance of the low-pass filter.

Accordingly, an error corrector according to an embodiment may detect and correct the error of the inverted quadrature signal Phase QB based on the seventh edge trigger signal Phase IB, QB and the eighth edge trigger signal Phase QB, I. Since the seventh period (1/4)*T and the eighth period (1/4)*T are the same, the level shifter may be removed and thus the size of the error corrector may be reduced. Additionally, distortion due to mismatch between the resistance of the level shifter and the resistance of the low-pass filter may be prevented.

It has been described that the error corrector is configured to generate the first to eighth edge trigger signals, but the embodiment is not necessarily limited thereto, and the error corrector according to an embodiment may generate more edge trigger signals of different phases based on other combinations of the first quadrature clock signal (for example, the quadrature signal Phase Q and inverted quadrature signal Phase QB, etc.).

Figure 5:
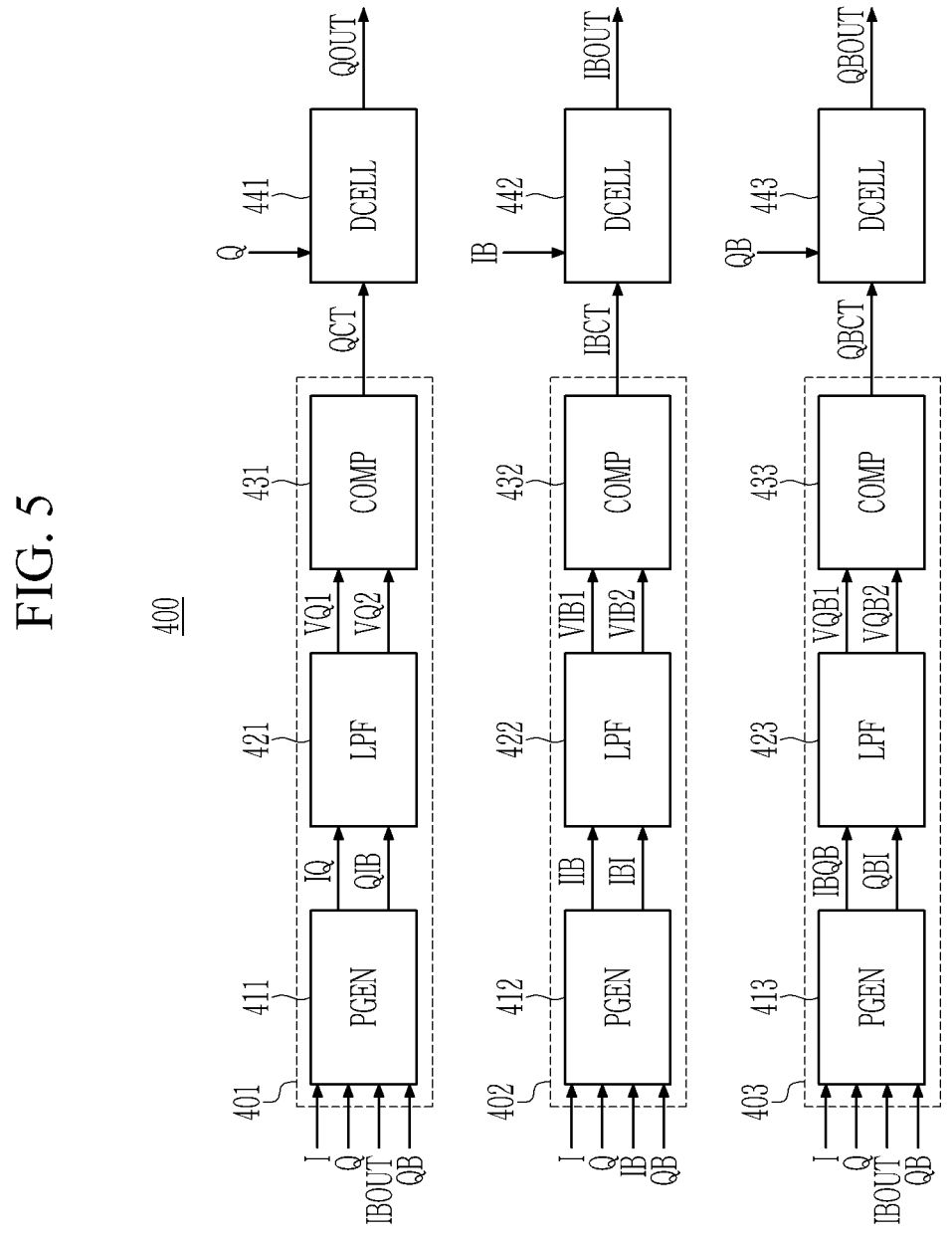
FIG. 5 is a block diagram for describing a quadrature error corrector according to an embodiment.
Figure 6:
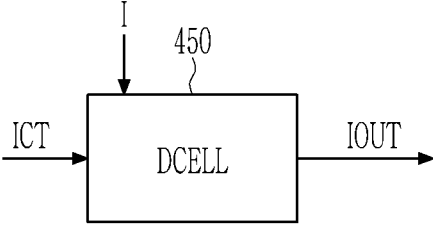
FIG. 6 is a block diagram for describing a quadrature error corrector according to an embodiment.

FIGS. 5 and 6 are block diagrams for describing a quadrature error corrector according to an embodiment. Referring to FIG. 5, a quadrature error corrector 400 according to an embodiment may receive first quadrature clock signals I, Q, IB, and QB. The quadrature error corrector 400 may detect and correct errors in the first quadrature clock signals I, Q, IB, QB and generate second quadrature clock signals IOUT, QOUT, IBOUT and QBOUT. As shown, the quadrature error corrector 400 may include a plurality of quadrature error detectors 401, 402, and 403 and a plurality of delay cells 441, 442, and 443.

The plurality of quadrature error detectors 401, 402, and 403 may detect errors in a quadrature signal Q, an inverted in-phase signal IB, and an inverted quadrature signal QB among the first quadrature clock signals I, Q, IB, and QB. For example, the first quadrature error detector 401 may detect an error in the quadrature signal Q to generate an error value QCT, the second quadrature error detector 402 may detect an error in the inverted in-phase signal IB to generate an error value IBCT, and the third quadrature error detector 403 may detect an error in the inverted quadrature signal QB to generate an error value QBCT.

The plurality of quadrature error detectors 401, 402, and 403 may transfer error values QCT, IBCT, QBCT to the plurality of delay cells 441, 442, and 443. The plurality of delay cells 441, 442, and 443 may correct the errors of the quadrature signal Q, the inverted in-phase signal IB, and the inverted quadrature signal QB based on the error values QCT, IBCT and QBCT. For example, the plurality of delay cells 441, 442, and 443 may adjust at least one of the duty ratio or phase of the signal based on the error values QCT, IBCT, and QBCT.

In an embodiment, the second quadrature error detector 402 among the plurality of quadrature error detectors 401, 402, and 403 may operate first. The second quadrature error detector 402 may receive the first quadrature clock signals I, Q, IB and QB. The second quadrature error detector 402 may detect an error in the inverted in-phase signal IB based on the first quadrature clock signals I, Q, IB, and QB and generate the error value IBCT.

The second quadrature error detector 402 may include a pulse generator (PGEN) 412, a low-pass filter (LPF) 422, and a comparator (COMP) 432. The PGEN 412 may receive the first quadrature clock signals I, Q, IB, and QB. The PGEN 412 may generate edge trigger signals IIB and IBI based on the first quadrature clock signals I, Q, IB, and QB. The edge trigger signal IIB may be a signal having a period from the edge of the in-phase signal I to the edge of the inverted in-phase signal IB. The edge trigger signal IBI may be a signal having a period from the edge of the inverted in-phase signal IB to the edge of the in-phase signal I. The PGEN 412 may output the edge trigger signals IIB and IBI to the LPF 422.

The LPF 422 may generate voltages VIB1 and VIB2 based on the edge trigger signals IIB and IBI. In an embodiment, the LPF 422 may convert duty information of the edge trigger signals IIB and IBI into the voltages VIB1 and VIB2. For example, if the duty information of the edge trigger signal IIB is greater than 2/4*T, the LPF 422 may generate a voltage VIB1 greater than 0.5*VDD. VDD may be a driving voltage applied to the LPF 422. When the duty information of the edge trigger signal IIB is less than 2/4*T, the LPF 422 may generate the voltage VIB1 less than 0.5*VDD. The LPF 422 may output the voltages VIB1 and VIB2 to the COMP 432.

The COMP 432 may generate an error IBCT in the inverted in-phase signal IB based on the voltages VIB1 and VIB2. The COMP 432 may output the error IBCT to a delay cell 442. The delay cell 442 may receive the inverted in-phase signal IB and the error IBCT. The delay cell 442 may adjust at least one of the duty ratio or phase of the inverted in-phase signal IB based on the error IBCT. That is, the delay cell 442 may output an error correction signal IBOUT in which the error of the inverted in-phase signal IB is corrected. The error correction signal IBOUT has a phase difference from the in-phase signal I by π (i.e., 180 degrees), and the duty ratio may be the same.

When the error of the inverted in-phase signal IB is corrected by the second quadrature error detector 402 and the delay cell 442, the first and third quadrature error detectors 401 and 403 may then operate. In an embodiment, the first and third quadrature error detectors 401 and 403 may receive the first quadrature clock signals I, Q, and QB and the error correction signal IBOUT (as a feedback signal).

The first quadrature error detector 401 may detect an error in the quadrature signal Q based on the first quadrature clock signals I, Q, and QB and the error correction signal IBOUT and generate an error value QCT. As shown, the first quadrature error detector 401 may include a pulse generator 411, a low-pass filter 421, and a comparator 431. The pulse generator 411 may generate edge trigger signals IQ, QIB based on the first quadrature clock signals I, Q, and QB and the error correction signal IBOUT. The edge trigger signal IQ may be a signal having a period from the edge of the in-phase signal I to the edge of the quadrature signal Q. The edge trigger signal QIB may be a signal having a period from the edge of the quadrature signal Q to the edge of the inverted in-phase signal IB. The pulse generator 411 may output the edge trigger signals IQ, QIB to the low-pass filter 421.

The low-pass filter 421 may generate voltages VQ1 and VQ2 based on the edge trigger signals IQ and QIB. In an embodiment, the low-pass filter 421 may convert duty information of the edge trigger signals IQ and QIB into the voltages VQ1 and VQ2. For example, if the duty information of the edge trigger signal IQ is greater than 1/4*T, the low-pass filter 421 may generate the voltage VQ1 greater than 0.25*VDD, where VDD may be a driving voltage applied to the low-pass filter 421. When the duty information of the edge trigger signal IQ is less than 1/4*T, the low-pass filter 421 may generate the voltage VQ1 less than 0.25*VDD. The low-pass filter 421 may output the voltages VQ1 and VQ2 to the comparator 431.

The comparator 431 may generate the error QCT of the quadrature signal Q based on the voltages VQ1 and VQ2. The comparator 431 may output the error QCT to the delay cell 441. The delay cell 441 may receive the quadrature signal Q and the error QCT. The delay cell 441 may adjust at least one of the duty ratio and phase of the quadrature signal Q based on the error QCT. That is, the delay cell 441 may output the error correction signal QOUT in which the error of the quadrature signal Q is corrected. The error correction signal QOUT has a phase difference from the in-phase signal I by π/2 (i.e., 90 degrees), and the duty ratio may be the same.

Next, the third quadrature error detector 403 may detect an error in the inverted quadrature signal QB based on the first quadrature clock signals I, Q, and QB and the error correction signal IBOUT, and generate the error value QBCT. The third quadrature error detector 403 may include a pulse generator 413, a low-pass filter 423, and a comparator 433. The pulse generator 413 may generate edge trigger signals IBQB and QBI based on the first quadrature clock signals I, Q, and QB and the error correction signal IBOUT. The edge trigger signal IBQB may be a signal having a period from the edge of the inverted in-phase signal IB to the edge of the inverted quadrature signal QB. The edge trigger signal QBI may be a signal having a period from the edge of the inverted quadrature signal QB to the edge of the in-phase signal I. The pulse generator 413 may output the edge trigger signals IBQB and QBI to the low-pass filter 423.

The low-pass filter 423 may generate voltages VQB1 and VQB2 based on the edge trigger signals IBQB and QBI. In an embodiment, the low-pass filter 423 may convert duty information of the edge trigger signals IBQB and QBI into the voltages VQB1 and VQB2. For example, when the duty information of the edge trigger signal IBQB is greater than 1/4*T, the low-pass filter 423 may generate the voltage VQB1 greater than 0.25*VDD. VDD may be a driving voltage applied to the low-pass filter 423. When the duty information of the edge trigger signal IBQB is less than 1/4*T, the low-pass filter 423 may generate the voltage VQB1 less than 0.25*VDD. The low-pass filter 423 may output the voltages VQB1 and VQB2 to the comparator 433.

The comparator 433 may generate the error QBCT of the inverted quadrature signal QB based on the voltages VQB1 and VQB2. The comparator 433 may output the error QBCT to the delay cell 443. The delay cell 443 may receive an inverted quadrature signal QB and the error QBCT. The delay cell 443 may adjust at least one of the duty ratio and phase of the inverted quadrature signal QB based on the error QBCT. That is, the delay cell 443 may output the error correction signal QBOUT in which the error of the inverted quadrature signal QB is corrected. The error correction signal QBOUT has a phase difference from the in-phase signal I by 3π/4 (i.e., 270 degrees), and the duty ratio may be the same.

In the above, it has been described that the first and third quadrature error detectors 401 and 403 are configured to detect errors based on the first quadrature clock signals I, Q, and QB and the error correction signal IBOUT. However, the embodiment is not necessarily limited thereto, and the first and third quadrature error detectors 401 and 403 may detect errors by receiving the first quadrature clock signals I, Q, IB, and QB.

Referring to FIGS. 5 and 6, the quadrature error corrector 400 according to an embodiment may further include a delay cell 450. The delay cell 450 may receive the in-phase signal I and a control signal ICT. The delay cell 450 may output the signal IOUT by adjusting at least one of the duty ratio and phase of the in-phase signal I based on the control signal ICT. The quadrature error corrector 400 may include control logic. The control logic may generate the control signal ICT indicating a delay by a fixed value and output the control signal ICT to the delay cell 450. In an embodiment, the plurality of quadrature error detectors 401, 402, and 403 of FIG. 5 may be implemented by receiving the signal IOUT instead of the in-phase signal I. That is, the plurality of quadrature error detectors 401, 402, and 403 may detect the errors in the quadrature signal Q, the inverted in-phase signal IB, and the inverted quadrature signal QB based on the signals IOUT, Q, IB, and QB (or signals IOUT, Q, IBOUT, and QB).

Figure 7:
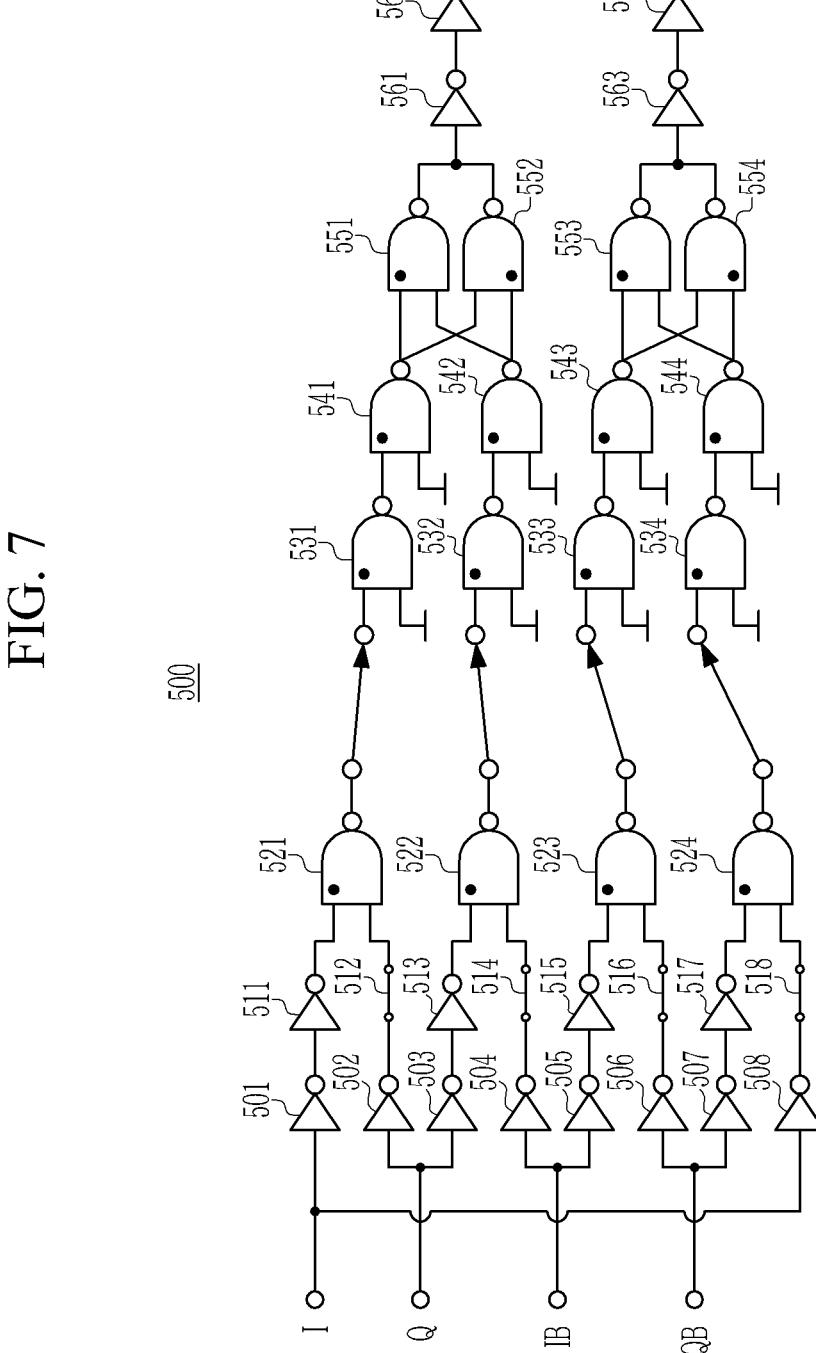
FIG. 7 illustrates a circuit diagram of a pulse generator according to an embodiment.

FIG. 7 illustrates a circuit diagram of a pulse generator 500 according to an embodiment. Referring to FIG. 7, the pulse generator 500 may receive first quadrature clock signals I, Q, IB, and QB. The first quadrature clock signals I, Q, IB, and QB may include the in-phase signal I, the inverted in-phase signal IB, the quadrature signal Q, and the inverted quadrature signal QB. Here, the in-phase signal I may be a signal with a fixed phase. For example, the in-phase signal I may be a signal that delays the system clock signal by a fixed value.

The pulse generator 500 may generate edge trigger signals IIB and IBI based on the first quadrature clock signals I, Q, IB, and QB. The edge trigger signal IIB may be a signal having a period from the edge of the in-phase signal I to the edge of the inverted in-phase signal IB. The edge trigger signal IBI may be a signal having a period from the edge of the inverted in-phase signal IB to the edge of the in-phase signal I. The pulse generator 500 may output the edge trigger signals IIB and IBI to a low-pass filter.

The pulse generator 500 according to an embodiment may include a plurality of inverters 501 to 508, 511, 513, 515, 517, 561 to 564, a plurality of switches 512, 514, 516, and 518, and a plurality of NAND gates 521 to 554. The plurality of switches 512, 514, 516, and 518 may be closed. In some embodiments, the plurality of switches 512, 514, 516, and 518 may be implemented as transmission gates TG.

The inverter 501 may receive and invert the in-phase signal I. The inverter 511 may generate a first signal by inverting the output signal of the inverter 501. The inverter 511 may output the first signal to the NAND gate 521. The first signal generated as the in-phase signal I passes through the inverters 501 and 511 may have a predetermined delay than the in-phase signal I.

The inverter 502 may receive and invert the quadrature signal Q. The switch 512 may generate a second signal by passing the output signal of the inverter 502. The switch 512 may output the second signal to the NAND gate 521. The second signal generated as the quadrature signal Q passes through the inverter 502 and the switch 512 has a predetermined delay compared to the quadrature signal Q, and may have an inverted value.

The NAND gate 521 may generate the third signal by performing a NAND operation on the first signal and the second signal. The NAND gate 521 may output the third signal to the NAND gate 531. The NAND gate 531 may receive the third signal and driving voltage. The NAND gate 531 may generate a fourth signal by performing a NAND operation on the third signal and the driving voltage. The NAND gate 531 may output the fourth signal to the NAND gate 541. The NAND gate 541 may receive the fourth signal and driving voltage. The NAND gate 541 may generate a fifth signal by performing a NAND operation on the fourth signal and the driving voltage. The NAND gate 541 may output the fifth signal to the NAND gates 551 and 552.

The inverter 503 may receive and invert the quadrature signal Q. The inverter 513 may generate a sixth signal by inverting the output signal of the inverter 503. The inverter 513 may output the sixth signal to the NAND gate 522. The sixth signal generated as the quadrature signal Q passes through the inverters 503 and 513 may have a predetermined delay compared to the quadrature signal Q.

The inverter 504 may receive and invert the inverted in-phase signal IB. The switch 514 may generate a seventh signal by passing the output signal of the inverter 504. The switch 514 may output the seventh signal to the NAND gate 522. The seventh signal generated as the inverted in-phase signal IB passes through the inverter 504 and the switch 514 has a predetermined delay compared to the inverted in-phase signal IB, and may have an inverted value.

The NAND gate 522 may generate an eighth signal by performing a NAND operation on the sixth and seventh signals. The NAND gate 522 may output the eighth signal to the NAND gate 532. The NAND gate 532 may receive the eighth signal and driving voltage. The NAND gate 532 may generate a ninth signal by performing a NAND operation on the eighth signal and the driving voltage. The NAND gate 532 may output a ninth signal to the NAND gate 542. The NAND gate 542 may receive the ninth signal and driving voltage. The NAND gate 542 may generate a tenth signal by performing a NAND operation on the ninth signal and the driving voltage. The NAND gate 542 may output the tenth signal to the NAND gates 551 and 552.

The NAND gates 551 and 552 may generate an eleventh signal by performing a NAND operation on the fifth signal and the tenth signal. The NAND gates 551 and 552 may output the eleventh signal to the inverter 561. The eleventh signal may pass through the inverters 561 and 562 to generate the edge trigger signal IIB. The edge trigger signal IIB may have a predetermined delay compared to the eleventh signal.

The inverter 505 may receive and invert the inverted in-phase signal IB. The inverter 515 may generate a twelfth signal by inverting the output signal of the inverter 505. The inverter 515 may output the twelfth signal to the NAND gate 523. The twelfth signal generated as the inverted in-phase signal IB passes through the inverters 505 and 515 may have a predetermined delay compared to the inverted in-phase signal IB.

The inverter 506 may receive and invert the inverted quadrature signal QB. The switch 516 may generate a thirteenth signal by passing the output signal of the inverter 506. The switch 516 may output the thirteenth signal to the NAND gate 523. The thirteenth signal generated as the inverted quadrature signal QB passes through the inverter 506 and the switch 516 has a predetermined delay compared to the inverted quadrature signal QB and may have an inverted value.

The NAND gate 523 may generate a fourteenth signal by performing a NAND operation on the twelfth signal and the thirteenth signal. The NAND gate 523 may output the fourteenth signal to the NAND gate 533. The NAND gate 533 may receive the fourteenth signal and driving voltage. The NAND gate 533 may generate a fifteenth signal by performing a NAND operation on the fourteenth signal and the driving voltage. The NAND gate 533 may output the fifteenth signal to the NAND gate 543. The NAND gate 543 may receive the fifteenth signal and the driving voltage. The NAND gate 543 may generate a sixteenth signal by performing a NAND operation on the fifteenth signal and the driving voltage. The NAND gate 543 may output the sixteenth signal to the NAND gates 553 and 554.

The inverter 507 may receive and invert the inverted quadrature signal QB. The inverter 517 may generate a seventeenth signal by inverting the output signal of the inverter 507. The inverter 517 may output the seventeenth signal to the NAND gate 524. The seventeenth signal generated as the inverted quadrature signal QB passes through the inverters 507 and 517 may have a predetermined delay compared to the inverted quadrature signal QB.

The inverter 508 may receive and invert the in-phase signal I. The switch 518 may generate an eighteenth signal by passing the output signal of the inverter 508. The switch 518 may output the eighteenth signal to the NAND gate 524. The eighteenth signal generated as the in-phase signal I passes through the inverter 508 and the switch 518 has a predetermined delay than the in-phase signal I and may have an inverted value. The delays of the first, second, sixth, seventh, twelfth, thirteenth, seventeenth, and eighteenth signals may be substantially the same. That is, the first, second, sixth, seventh, twelfth, thirteenth, seventeenth, and eighteenth signals may include delays of the same value as the first quadrature clock signals I, Q, IB, and QB.

The NAND gate 524 may generate a nineteenth signal by performing a NAND operation on the seventeenth signal and the eighteenth signal. The NAND gate 524 may output the nineteenth signal to the NAND gate 534. The NAND gate 534 may receive the nineteenth signal and the driving voltage. The NAND gate 534 may generate a twentieth signal by performing a NAND operation on the nineteenth signal and the driving voltage. The NAND gate 534 may output the twentieth signal to the NAND gate 544. The NAND gate 544 may receive the twentieth signal and driving voltage. The NAND gate 544 may generate a twenty-first signal by performing a NAND operation on the twentieth signal and the driving voltage. The NAND gate 544 may output the twenty-first signal to the NAND gates 553 and 554.

The NAND gates 553 and 554 may generate a twenty-second signal by performing a NAND operation on the sixteenth signal and the twenty-first signal. The NAND gates 553 and 554 may output the twenty-second signal to the inverter 563. The twenty-second signal may pass through the inverters 563 and 564 to generate the edge trigger signal IBI. The edge trigger signal IBI may have a predetermined delay compared to the twenty-second signal.

Figure 8:
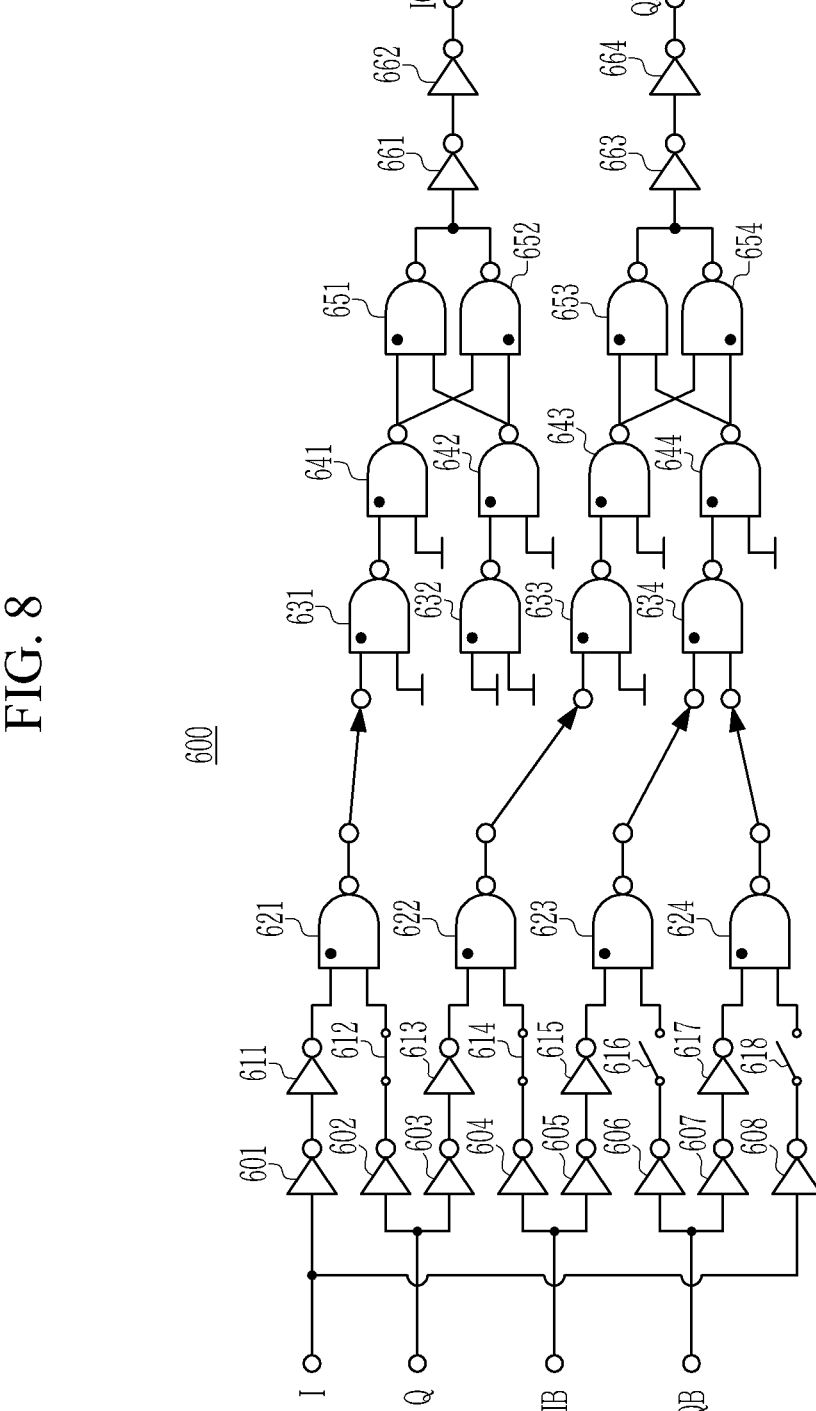
FIG. 8 illustrates a circuit diagram of a pulse generator according to an embodiment.

FIG. 8 illustrates a circuit diagram of a pulse generator 600 according to an embodiment. As shown, the pulse generator 600 may receive the first quadrature clock signals I, Q, IB, and QB. The first quadrature clock signals I, Q, IB, and QB may include the in-phase signal I, the inverted in-phase signal IB, the quadrature signal Q, and the inverted quadrature signal QB. Here, the in-phase signal I may be a signal with a fixed phase. For example, the in-phase signal I may be a signal that delays the system clock signal by a fixed value. In some embodiments, the inverted in-phase signal IB may be a signal in which the phase is fixed after the error is corrected. For example, the inverted in-phase signal IB may be the error correction signal IBOUT of FIG. 5.

The pulse generator 600 may generate the edge trigger signals IQ, QIB based on the first quadrature clock signals I, Q, IB, and QB. The edge trigger signal IQ may be a signal having a period from the edge of the in-phase signal I to the edge of the quadrature signal Q. The edge trigger signal QIB may be a signal having a period from the edge of the quadrature signal Q to the edge of the inverted in-phase signal IB. The pulse generator 600 may output the edge trigger signals IQ and QIB to a low-pass filter.

The pulse generator 600 according to an embodiment may include a plurality of inverters 601 to 608, 611, 613, 615, 617, 661 to 664, a plurality of switches 612, 614, 616, and 618, and a plurality of NAND gates 621 to 654. Among the plurality of switches 612, 614, 616, and 618, switches 612 and 614 may be closed and switches 616 and 618 may be open. In some embodiments, the plurality of switches 612, 614, 616, and 618 may be implemented as transmission gates TG.

The inverters 601 to 605, 611, 613, and 615, switches 612 and 614, and NAND gates 621, 631, and 641 may operate substantially the same as the inverters 501 to 505, 511, 513, and 515, the switches 512 and 514, and the NAND gates 521, 531, and 541 of FIG. 7. Accordingly, redundant description will be omitted.

The NAND gate 632 may receive driving voltages from both input terminals. The NAND gate 632 may generate a twenty-third signal by performing a NAND operation on the two driving voltages. For example, the twenty-third signal may have a value of '0'. The NAND gate 632 may output the twenty-third signal to the NAND gate 642. The NAND gate 642 may generate a twenty-fourth signal by performing a NAND operation on the twenty-third signal and the driving voltage. The NAND gate 642 may output the twenty-fourth signal to the NAND gates 651 and 652.

The NAND gates 651 and 652 may generate a twenty-fifth signal by performing a NAND operation on the fifth signal in FIG. 7 and the twenty-fourth signal in FIG. 8. The NAND gates 651 and 652 may output the twenty-fifth signal to the inverter 661. The twenty-fifth signal may pass through the inverters 661 and 662 to generate the edge trigger signal IQ. The edge trigger signal IQ may have a predetermined delay compared to the twenty-fifth signal.

The NAND gate 622 may generate the eighth signal by performing a NAND operation on the sixth and seventh signals described in FIG. 7. The NAND gate 622 may output the eighth signal to the NAND gate 633. The NAND gate 633 may receive the eighth signal and driving voltage. The NAND gate 633 may generate a twenty-sixth signal by performing a NAND operation on the eighth signal and the driving voltage. The NAND gate 633 may output the twenty-sixth signal to the NAND gate 643. The NAND gate 643 may receive the twenty-sixth signal and the driving voltage. The NAND gate 643 may generate a twenty-seventh signal by performing a NAND operation on the twenty-sixth signal and the driving voltage. The NAND gate 643 may output the twenty-seventh signal to the NAND gates 653 and 654.

The NAND gate 623 may receive the twelfth signal of FIG. 7 from one input terminal. The twelfth signal may have a predetermined delay compared to the inverted in-phase signal IB. The other input terminal of the NAND gate 623 may be connected to the switch 617. Since the switch 617 is open, the NAND gate 623 may not receive signals from other input terminals. The NAND gate 623 may generate the twenty-eighth signal by performing a NAND operation on the twelfth signal and the value of '0'. For example, the twenty-eighth signal may have a value of '1'. The NAND gate 623 may output the twenty-eighth signal to the NAND gate 634.

The inverter 607 may receive and invert the inverted quadrature signal QB. The inverter 617 may generate the twenty-ninth signal by inverting the output signal of the inverter 607. The inverter 617 may output the twenty-ninth signal to the NAND gate 624. The twenty-ninth signal generated as the inverted quadrature signal QB passes through the inverters 607 and 617 may have a predetermined delay compared to the inverted quadrature signal QB.

The NAND gate 624 receives the twenty-ninth signal from one input terminal, and since the switch 618 is open, The NAND gate 624 may not receive a signal from the other input terminal. The NAND gate 624 may generate the thirtieth signal by performing a NAND operation on the twenty-ninth signal and the value of '0'. For example, the thirtieth signal may have a value of '1'. The NAND gate 624 may output the thirtieth signal to the NAND gate 634.

The NAND gate 634 may receive the twenty-eighth and thirtieth signals. The NAND gate 634 may generate a thirty-first signal by performing a NAND operation on the twenty-eighth and thirtieth signals. The NAND gate 634 may output the thirty-first signal to the NAND gate 644. The NAND gate 644 may receive the thirty-first signal and driving voltage. The NAND gate 644 may generate a thirty-second signal by performing a NAND operation on the thirty-first signal and the driving voltage. The NAND gate 644 may output the thirty-second signal to the NAND gates 653 and 654.

The NAND gates 653 and 654 may generate a thirty-third signal by performing a NAND operation on the twenty-seventh signal and the thirty-second signal. The NAND gates 653 and 654 may output a thirty-third signal to the inverter 663. The thirty-third signal may pass through the inverters 663 and 664 to generate the edge trigger signal QIB. The edge trigger signal QIB may have a predetermined delay compared to the thirty-third signal.

Figure 9:
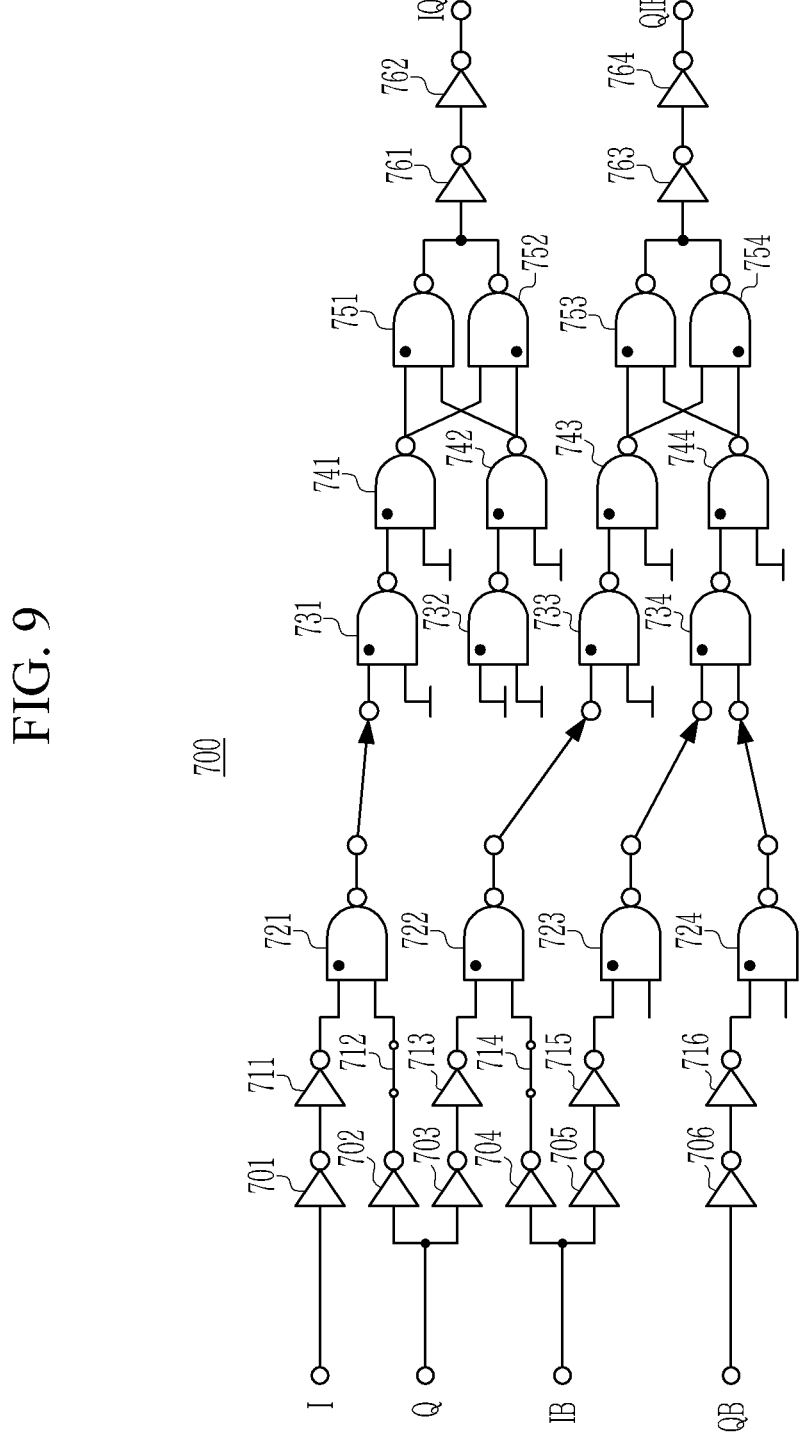
FIG. 9 illustrates a circuit diagram of a pulse generator according to an embodiment.

FIG. 9 illustrates a circuit diagram of a pulse generator 700 according to an embodiment. Referring to FIG. 9, the pulse generator 700 may receive the first quadrature clock signals I, Q, IB, and QB. The first quadrature clock signals I, Q, IB, and QB may include the in-phase signal I, the inverted in-phase signal IB, the quadrature signal Q, and the inverted quadrature signal QB. Here, the in-phase signal I may be a signal with a fixed phase. For example, the in-phase signal I may be a signal that delays the system clock signal by a fixed value. In some embodiments, the inverted in-phase signal IB may be a signal in which the phase is fixed after the error is corrected. For example, the inverted in-phase signal IB may be the error correction signal IBOUT of FIG. 5.

The pulse generator 700 may generate the edge trigger signals IQ, QIB based on the first quadrature clock signals I, Q, IB, and QB. The edge trigger signal IQ may be a signal having a period from the edge of the in-phase signal I to the edge of the quadrature signal Q. The edge trigger signal QIB may be a signal having a period from the edge of the quadrature signal Q to the edge of the inverted in-phase signal IB. The pulse generator 700 may output the edge trigger signals IQ and QIB to a low-pass filter.

The pulse generator 700 according to an embodiment may include a plurality of inverters 701 to 706, 711, 713, 715, 716, 761 to 764, a plurality of switches 712 and 714, and a plurality of NAND gates 721 to 754. The plurality of switches 712 and 714 may be closed. In some embodiments, the plurality of switches 712 and 714 may be implemented as transmission gates TG.

The pulse generator 700 is obtained by removing the constituent elements corresponding to the open switches 616 and 618 from the pulse generator 600 of FIG. 8. For example, the pulse generator 700 may be obtained by removing the inverters 606 and 608 and the switches 616 and 618 from the pulse generator 600. Accordingly, the circuit of the pulse generator 700 may be simplified and the area may be reduced.

The plurality of inverters 701 to 706, 711, 713, 715, 716, 761 to 764, a plurality of switches 712 and 714, and the plurality of NAND gates 721 to 754 may be substantially the same as the plurality of inverters 601 to 605, 607, 611, 613, 615, 617, 661 to 664, the plurality of switches 612 and 614, and a plurality of NAND gates 621 to 654 in FIG. 8. Accordingly, redundant description will be omitted.

Figure 10:
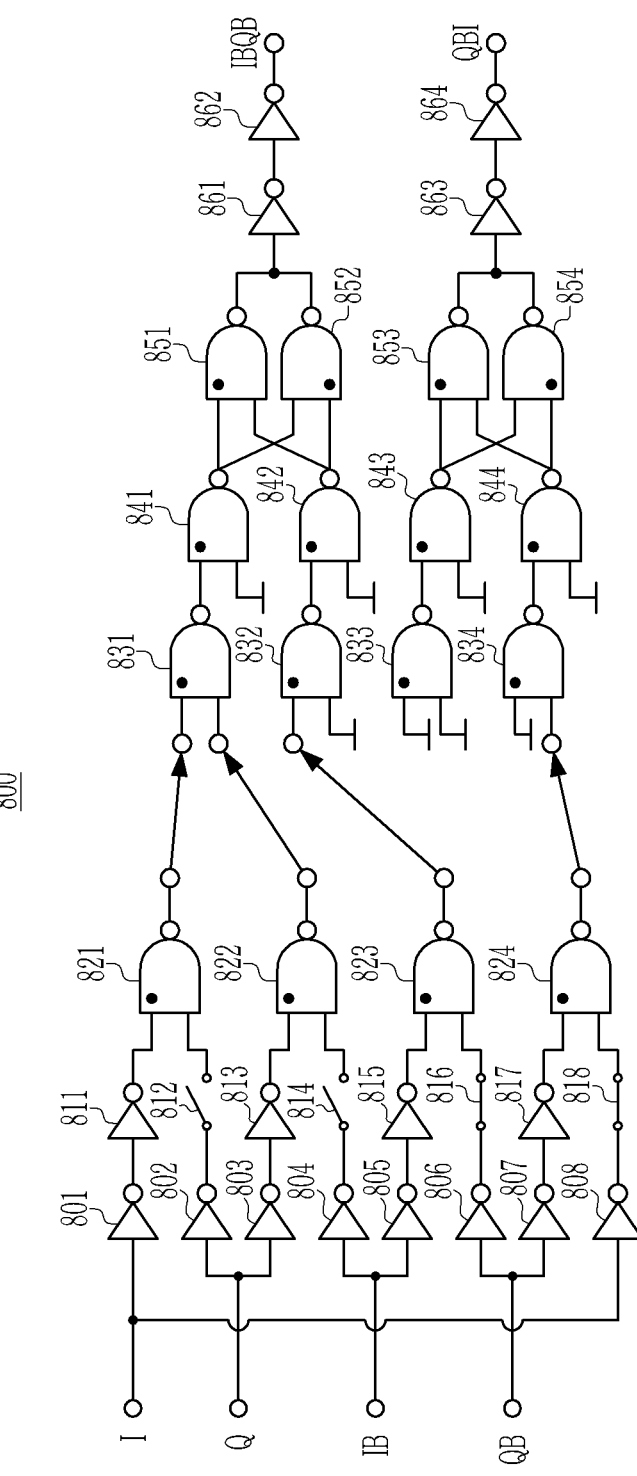
FIG. 10 illustrates a circuit diagram of a pulse generator according to an embodiment.

FIG. 10 illustrates a circuit diagram of a pulse generator 800 according to an embodiment. Referring to FIG. 10, the pulse generator 800 may receive the first quadrature clock signals I, Q, IB, and QB. The first quadrature clock signals I, Q, IB, and QB may include the in-phase signal I, the inverted in-phase signal IB, the quadrature signal Q, and the inverted quadrature signal QB. Here, the in-phase signal I may be a signal with a fixed phase. For example, the in-phase signal I may be a signal that delays the system clock signal by a fixed value. In some embodiments, the inverted in-phase signal IB may be a signal in which the phase is fixed after the error is corrected. For example, the inverted in-phase signal IB may be the error correction signal IBOUT of FIG. 5.

The pulse generator 800 may generate the edge trigger signals IBQB and QBI based on the first quadrature clock signals I, Q, IB, and QB. The edge trigger signal IBQB may be a signal having a period from the edge of the inverted in-phase signal IB to the edge of the inverted quadrature signal QB. The edge trigger signal QBI may be a signal having a period from the edge of the inverted quadrature signal QB to the edge of the in-phase signal I. The pulse generator 800 may output the edge trigger signals IBQB and QBI to a low-pass filter.

The pulse generator 800 according to an embodiment may include a plurality of inverters 801 to 808, 811, 813, 815, 817, 861 to 864, a plurality of switches 812, 814, 816, and 818 and a plurality of NAND gates 821 to 854. Among the plurality of switches 812, 814, 816, and 818, switches 812 and 814 may be open and switches 816 and 818 may be closed. In some embodiments, the plurality of switches 812, 814, 816, and 818 may be implemented as transmission gates TG.

The inverters 801, 803, 805 to 808, 811, 813, 815 to 817, the switches 816 and 818, and NAND gates 834 and 844 may operate substantially the same as the inverters 501, 503, 505 to 508, 511, 513, 515 to 517, the switches 516 and 518, and the NAND gates 534 and 544 of FIG. 7. Accordingly, redundant description will be omitted.

The NAND gate 821 may receive the first signal of FIG. 7 from one input terminal. The first signal may have a predetermined delay compared to the in-phase signal I. The other input terminal of the NAND gate 821 may be connected to the switch 812. Since the switch 812 is open, the NAND gate 821 may not receive signals from other input terminals. The NAND gate 821 may generate the thirty-fourth signal by performing a NAND operation on the first signal and the value of '0'. For example, the thirty-fourth signal may have a value of '1'. The NAND gate 821 may output the thirty-fourth signal to the NAND gate 831.

Additionally, the NAND gate 822 may receive the sixth signal of FIG. 7 from one input terminal. The sixth signal may have a predetermined delay compared to the quadrature signal Q. The other input terminal of the NAND gate 822 may be connected to the switch 814. Since the switch 814 is open, the NAND gate 822 may not receive signals from other input terminals. The NAND gate 822 may generate a thirty-fifth signal by performing a NAND operation on the 6th signal and the value of '0'. For example, the thirty-fifth signal may have a value of '1'. The NAND gate 822 may output the thirty-fifth signal to the NAND gate 831.

The NAND gate 831 may generate a thirty-sixth signal by performing a NAND operation on the thirty-fourth and thirty-fifth signals. The NAND gate 831 may output thirty-sixth signal to the NAND gate 841. The NAND gate 841 may receive the thirty-sixth signal and driving voltage. The NAND gate 841 may generate a thirty-seventh signal by performing a NAND operation on the thirty-sixth signal and the driving voltage. The NAND gate 841 may output the thirty-seventh signal to the NAND gates 851 and 852.

The NAND gate 823 may output the twelfth signal of FIG. 7 to the NAND gate 832. The NAND gate 832 may receive the twelfth signal and the driving voltage. The NAND gate 832 may generate a thirty-eighth signal by performing a NAND operation on the twelfth signal and the driving voltage. The NAND gate 832 may output the thirty-eighth signal to a NAND gate 842. The NAND gate 842 may receive the thirty-eighth signal and driving voltage. The NAND gate 842 may generate a thirty-ninth signal by performing a NAND operation on the thirty-eighth signal and the driving voltage. The NAND gate 842 may output the thirty-eighth signal to the NAND gates 851 and 852.

The NAND gates 851 and 852 may generate a fortieth signal by performing a NAND operation on the thirty-seventh signal and the thirty-ninth signal. The NAND gates 851 and 852 may output the fortieth signal to the inverter 861. The fortieth signal may pass through the inverters 861 and 862 to generate the edge trigger signal IBQB. The edge trigger signal IBQB may have a predetermined delay compared to the fortieth signal.

A NAND gate 833 may receive driving voltages from both input terminals. The NAND gate 833 may generate the forty-first signal by performing a NAND operation on the two driving voltages. For example, the forty-first signal may have a value of '0'. The NAND gate 833 may output the forty-first signal to a NAND gate 843. The NAND gate 843 may generate a forty-second signal by performing a NAND operation on the forty-first signal and the driving voltage. The NAND gate 843 may output the forty-second signal to NAND gates 853 and 854.

The NAND gate 824 may output the nineteenth signal of FIG. 7 to the NAND gate 834. The NAND gate 834 may generate a forty-third signal by performing a NAND operation on the nineteenth signal and the driving voltage. The NAND gate 834 may output the forty-third signal to the NAND gate 844. The NAND gate 844 may generate a forty-fourth signal by performing a NAND operation on the forty-third signal and the driving voltage. The NAND gate 844 may output the forty-fourth signal to the NAND gates 853 and 854.

The NAND gates 853 and 854 may generate a forty-fifth signal by performing a NAND operation on the forty-second and forty-fourth signals. The NAND gates 853 and 854 may output the forty-fifth signal to an inverter 863. The forty-fifth signal may pass through the inverters 863 and 864 to generate the edge trigger signal QBI. The edge trigger signal QBI may have a predetermined delay compared to the forty-fifth signal.

Figure 11:
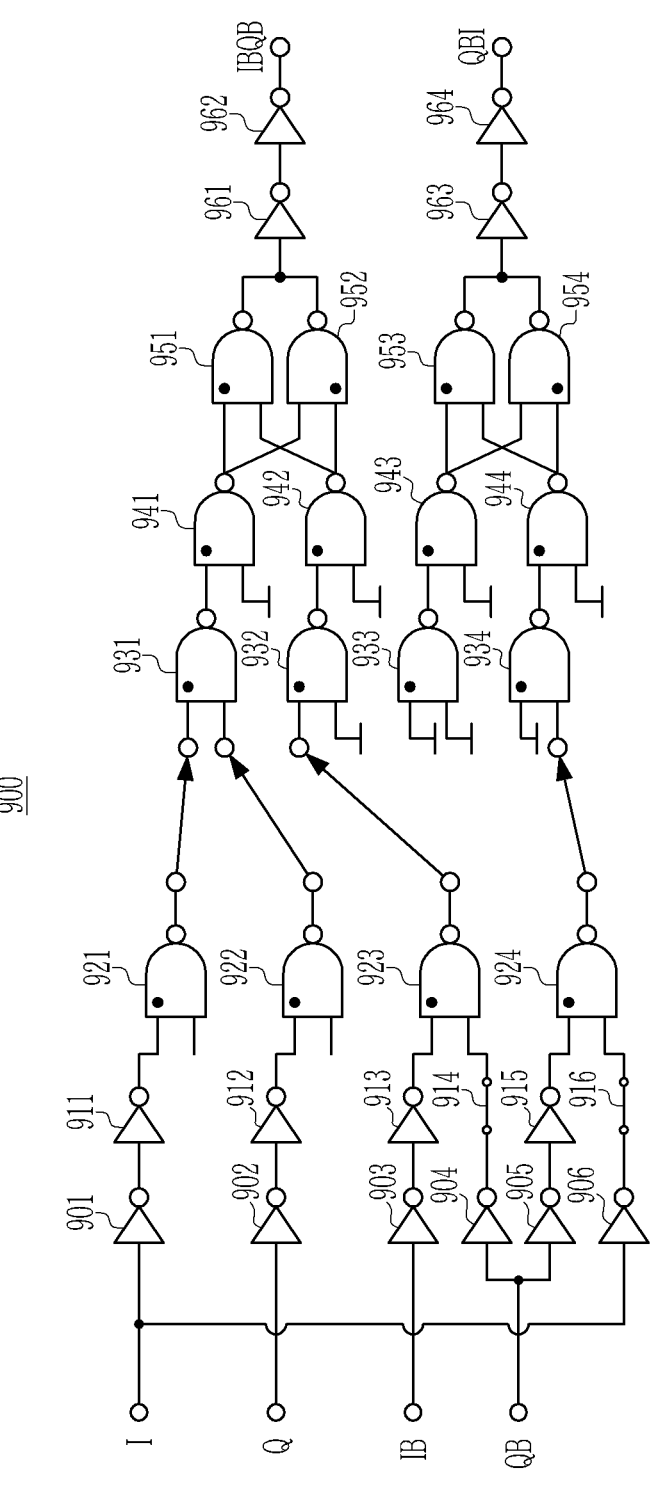
FIG. 11 illustrates a circuit diagram of a pulse generator according to an embodiment.

FIG. 11 illustrates a circuit diagram of a pulse generator 900 according to an embodiment. Referring to FIG. 11, the pulse generator 900 may receive the first quadrature clock signals I, Q, IB, and QB. The first quadrature clock signals I, Q, IB, and QB may include the in-phase signal I, the inverted in-phase signal IB, the quadrature signal Q, and the inverted quadrature signal QB. Here, the in-phase signal I may be a signal with a fixed phase. For example, the in-phase signal I may be a signal that delays the system clock signal by a fixed value. In some embodiments, the inverted in-phase signal IB may be a signal in which the phase is fixed after the error is corrected. For example, the inverted in-phase signal IB may be the error correction signal IBOUT of FIG. 5.

The pulse generator 900 may generate the edge trigger signals IBQB and QBI based on the first quadrature clock signals I, Q, IB, and QB. The edge trigger signal IBQB may be a signal having a period from the edge of the inverted in-phase signal IB to the edge of the inverted quadrature signal QB. The edge trigger signal QBI may be a signal having a period from the edge of the inverted quadrature signal QB to the edge of the in-phase signal I. The pulse generator 800 may output the edge trigger signals IBQB and QBI to a low-pass filter.

The pulse generator 900 according to an embodiment may include a plurality of inverters 901 to 906, 911 to 913, 915, and 961 to 964, a plurality of switches 912 and 916, and a plurality of NAND gates 921 to 954. The plurality of switches 914 and 916 may be closed. In some embodiments, the plurality of switches 914 and 916 may be implemented as transmission gates TG.

The pulse generator 900 is obtained by removing the constituent elements corresponding to the open switches 812 and 814 from the pulse generator 800 of FIG. 10. For example, the pulse generator 900 may be obtained by removing the inverters 802 and 804 and the switches 812 and 814 from the pulse generator 800. Accordingly, the circuit of the pulse generator 900 may be simplified and the area may be reduced.

The plurality of inverters 901 to 906, 911 to 913, 915, and 961 to 964, the plurality of switches 914 and 916, and the plurality of NAND gates 921 to 954 may be substantially the same as the plurality of inverters 801, 803, 805 to 808, 811, 813, 815, 817, and 861 to 864, the plurality of switches 816 and 818, and the plurality of NAND gates 821 to 854 in FIG. 10. Accordingly, redundant description will be omitted.

Figure 12:
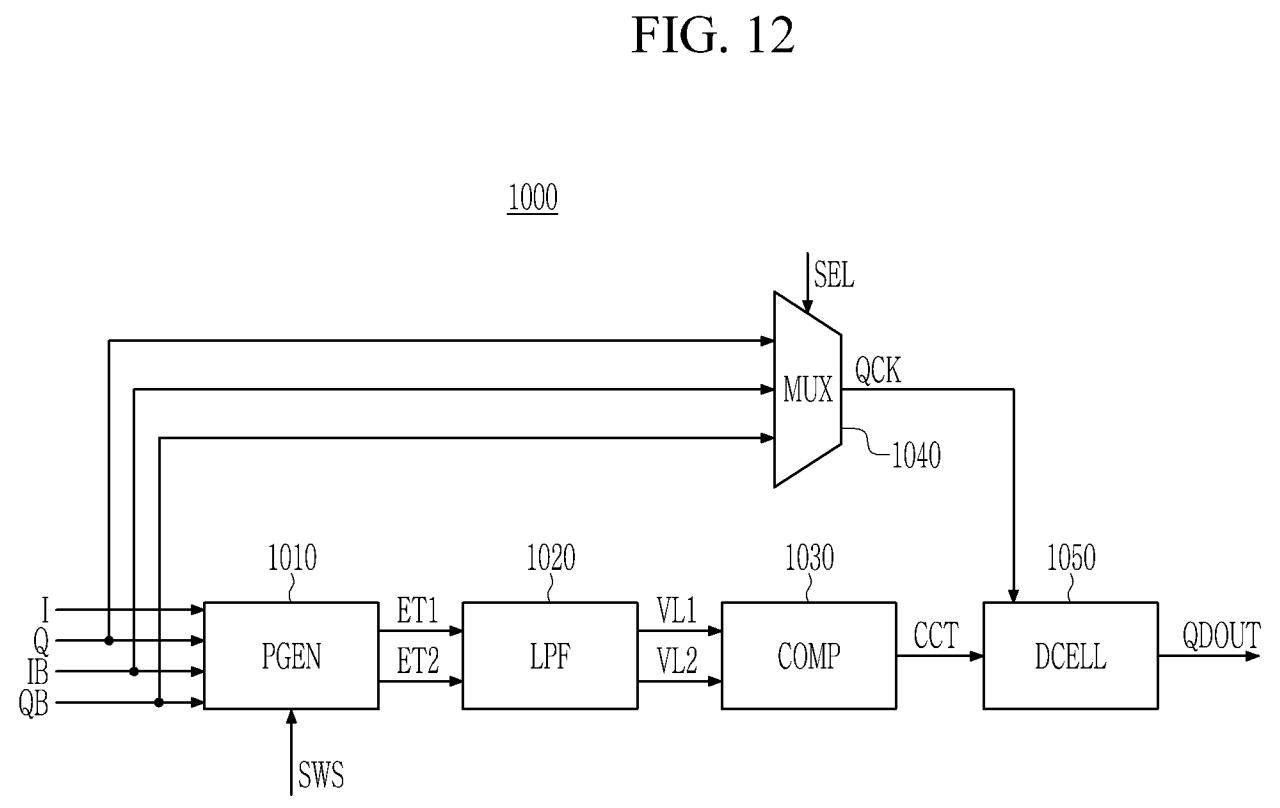

FIG. 12 is a block diagram for describing a quadrature error corrector 1000 according to an embodiment. Referring to FIG. 12, the quadrature error corrector 1000 may receive the first quadrature clock signals I, Q, IB, and QB. The first quadrature clock signals I, Q, IB, and QB may include the in-phase signal I, the quadrature signal Q, the inverted in-phase signal IB, and the inverted quadrature signal QB. The quadrature error corrector 1000 may detect and correct errors in the first quadrature clock signals I, Q, IB, and QB to generate a second quadrature clock signal QDOUT.

In some embodiments, the quadrature error corrector 1000 may correct errors in the inverted in-phase signal IB first, and then use the error-corrected inverted in-phase signal IB to correct errors in each of the quadrature signal Q and the inverted quadrature signal QB.

The quadrature error corrector 1000 may include a pulse generator (PGEN) 1010, a low-pass filter (LPF) 1020, a comparator (COMP) 1030, a multiplexer (MUX) 1040, and a delay cell (DCELL) 1050. The PGEN 1010 may receive the first quadrature clock signals I, Q, IB, and QB. The PGEN 1010 may generate edge trigger signals ET1 and ET2 based on the first quadrature clock signals I, Q, IB, and QB. The edge trigger signals ET1 and ET2 may be signals having a period between the edges of two of the first quadrature clock signals I, Q, IB, and QB. For example, the description of the interval signal in FIG. 4 may be applied to the edge trigger signals ET1 and ET2. In an embodiment, the edge trigger signals ET1, ET2 may be edge trigger signals of Phase I,Q, Phase Q,IB, Phase I,IB, Phase IB,I, Phase IB,QB, or Phase Q, BI.

The PGEN 1010 may include a plurality of switches that open and close based on a switch selection signal SWS. The plurality of switches may change one or more paths through which the first quadrature clock signals I, Q, IB, and QB pass through the constituent elements of the PGEN 1010 by opening and closing based on the switch selection signal SWS. That is, the PGEN 1010 may generate the edge trigger signals ET1 and ET2 based on the switch selection signal SWS. The configuration in which the PGEN 1010 generates the edge trigger signals ET1 and ET2 will be described later with reference to FIG. 13.

The LPF 1020 may generate voltages VL1 and VL2 based on the edge trigger signals ET1 and ET2. In an embodiment, the LPF 1020 may convert duty information of the edge trigger signals ET1 and ET2 into the voltages VL1 and VL2. The LPF 1020 may output the voltages VL1 and VL2 to the COMP 1030.

The COMP 1030 may generate an error CCT based on the voltages VL1 and VL2. The COMP 1030 may output the error CCT to the DCELL 1050.

The MUX 1040 may select one of the quadrature signal Q, the inverted in-phase signal IB, and the inverted quadrature signal QB based on a clock selection signal SEL. The MUX 1040 may output the selected signal to the DCELL 1050 as a selection quadrature signal QCK.

The switch selection signal SWS and the clock selection signal SEL may be associated with each other. For example, if the clock selection signal SEL is configured to select the quadrature signal Q, the switch selection signal SWS may close the switches 612 and 614 and open the switches 616 and 618 like the pulse generator 600 in FIG. 8, and NAND gates 621 to 634 may be configured to be connected as shown in FIG. 8.

If the clock selection signal SEL is configured to select the inverted in-phase signal IB, the switch selection signal SWS may close the switches 512, 514, 516, and 518, like the pulse generator 500 in FIG. 7, and NAND gates 521 to 534 may be configured to be connected as shown in FIG. 7. If the clock selection signal SEL is configured to select the inverted quadrature signal QB, the switch selection signal SWS may open the switches 812 and 814 and close the switches 816 and 818 like the pulse generator 800 in FIG. 10, and the NAND gates 821 to 834 may be configured to be connected as shown in FIG. 10. In an embodiment, the control logic of the quadrature error corrector 1000 may generate the switch selection signal SWS and the clock selection signal SEL.

The DCELL 1050 may receive the selection quadrature signal QCK and the error CCT. The DCELL 1050 may adjust at least one of the duty ratio and phase of the selection quadrature signal QCK based on the error CCT. That is, the DCELL 1050 may output the second quadrature clock signal QDOUT in which an error in the selection quadrature signal QCK is corrected.

Figure 13:
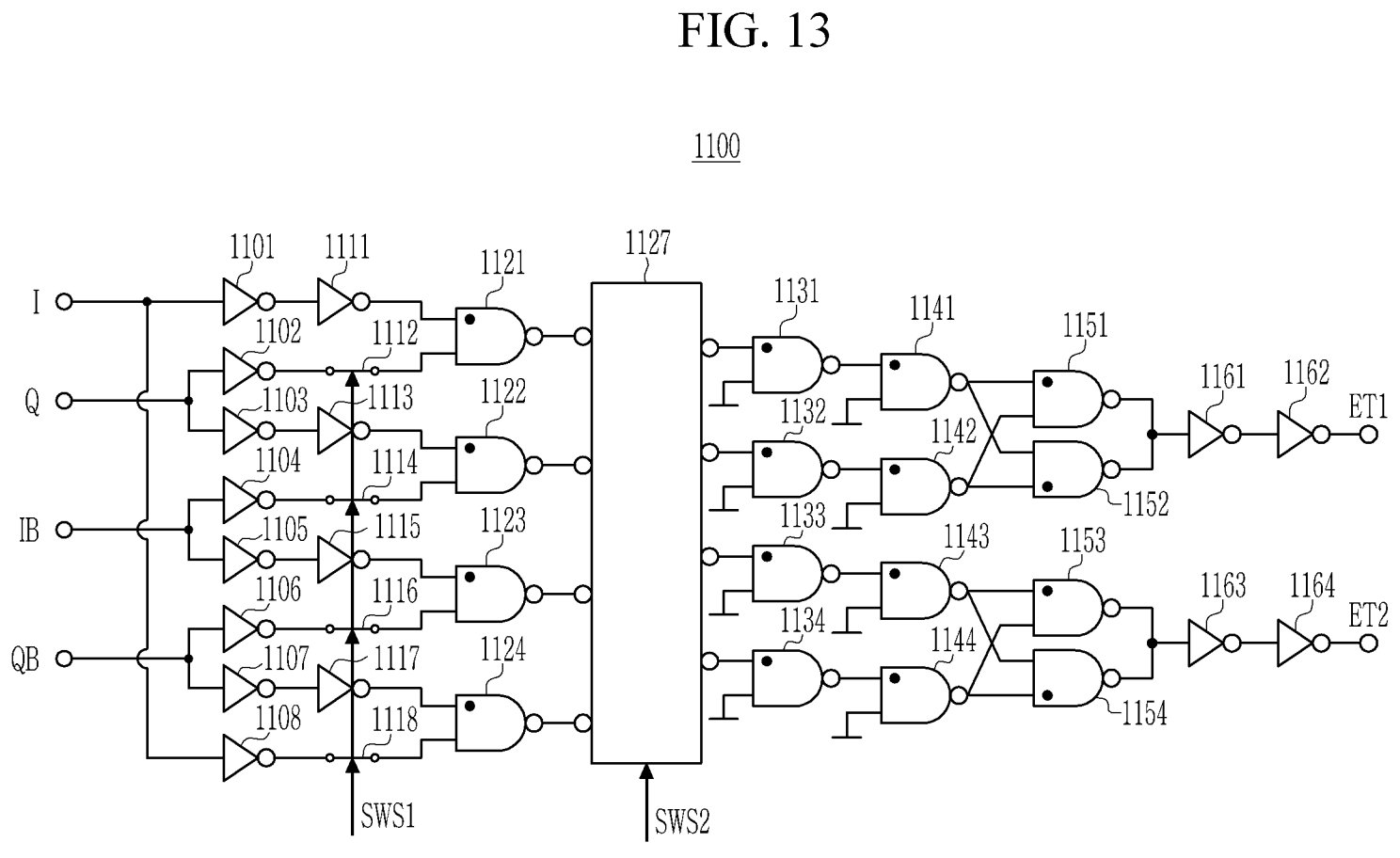

FIG. 13 illustrates a circuit diagram of a pulse generator 1100 according to an embodiment. Referring to FIG. 13, the pulse generator 1100 may receive first quadrature clock signals I, Q, IB, and QB. The first quadrature clock signals I, Q, IB, and QB may include the in-phase signal I, the inverted in-phase signal IB, the quadrature signal Q, and the inverted quadrature signal QB. Here, the in-phase signal I may be a signal with a fixed phase. For example, the in-phase signal I may be a signal that delays the system clock signal by a fixed value.

The pulse generator 1100 may generate the edge trigger signals ET1 and ET2 based on the first quadrature clock signals I, Q, IB, and QB. The edge trigger signals ET1 and ET2 may be signals having a period between the edges of two of the first quadrature clock signals I, Q, IB, and QB. The pulse generator 1100 may output the edge trigger signals ET1 and ET2 to a low-pass filter.

The pulse generator 1100 according to an embodiment may include a plurality of inverters 1101 to 1108, 1111, 1113, 1115, 1117, 1161 to 1164, a plurality of first switches 1112, 1114, 1116, and 1118, a second switch 1127, and a plurality of NAND gates 1121 to 1154. The description of the inverters, switches, and NAND gates described with reference to FIGS. 7 to 11 may be equally applied to the plurality of inverters 1101 to 1108, 1111, 1113, 1115, 1117, 1161 to 1164, the plurality of first switches 1112, 1114, 1116, and 1118, and the plurality of NAND gates 1121 to 1154. Accordingly, redundant description will be omitted.

In some embodiments, the plurality of first switches 1112, 1114, 1116, and 1118 may be implemented as transmission gates TG. The plurality of first switches 1112, 1114, 1116, and 1118 may be opened and closed based on a first switch selection signal SWS1. The second switch 1127 may connect the NAND gates 1121 to 1124 and the NAND gates 1131 to 1134 based on a second switch selection signal SWS2. The first switch selection signal SWS1 and the second switch selection signal SWS2 may be generated by the control logic of the pulse generator 1100.

In an embodiment, the first switch selection signal SWS1 may close the plurality of first switches 1112, 1114, 1116, and 1118, and the second switch selection signal SWS1 may connect the NAND gate 1121 and the NAND gate 1131, connect the NAND gate 1122 and the NAND gate 1132, connect the NAND gate 1123 and the NAND gate 1133, and connect the NAND gate 1124 and the NAND gate 1134. Accordingly, the pulse generator 1100 may output the edge trigger signal of the Phase I,IB and the edge trigger signal of the Phase IB,I as edge trigger signals ET1 and ET2. At this time, the clock selection signal SEL of FIG. 12 may be configured to select the inverted in-phase signal IB.

In an embodiment, the first switch selection signal SWS1 may close the first switches 1112 and 1114, open the first switches 1116 and 1118, and the second switch selection signal SWS1 may connect the NAND gate 1121 and the NAND gate 1131, connect the NAND gate 1122 and the NAND gate 1133, and connect the NAND gates 1123 and 1124 to the NAND gate 1134. Accordingly, the pulse generator 1100 may output the edge trigger signal of Phase I,Q and the edge trigger signal of Phase Q,IB as edge trigger signals ET1 and ET2. At this time, the clock selection signal SEL of FIG. 12 may be configured to select the quadrature signal Q.

In an embodiment, the first switch selection signal SWS1 may open the first switches 1112 and 1114, close the first switches 1116 and 1118, and the second switch selection signal SWS1 may connect the NAND gate 1121 and 1122 to the NAND gate 1131, connect the NAND gate 1123 and the NAND gate 1132, and connect the NAND gate 1124 and the NAND gate 1134. Accordingly, the pulse generator 1100 may output the edge trigger signal of Phase IB,QB and the edge trigger signal of Phase Q,BI as edge trigger signals ET1 and ET2. At this time, the clock selection signal SEL of FIG. 12 may be configured to select the inverted quadrature signal QB.

Figure 14:
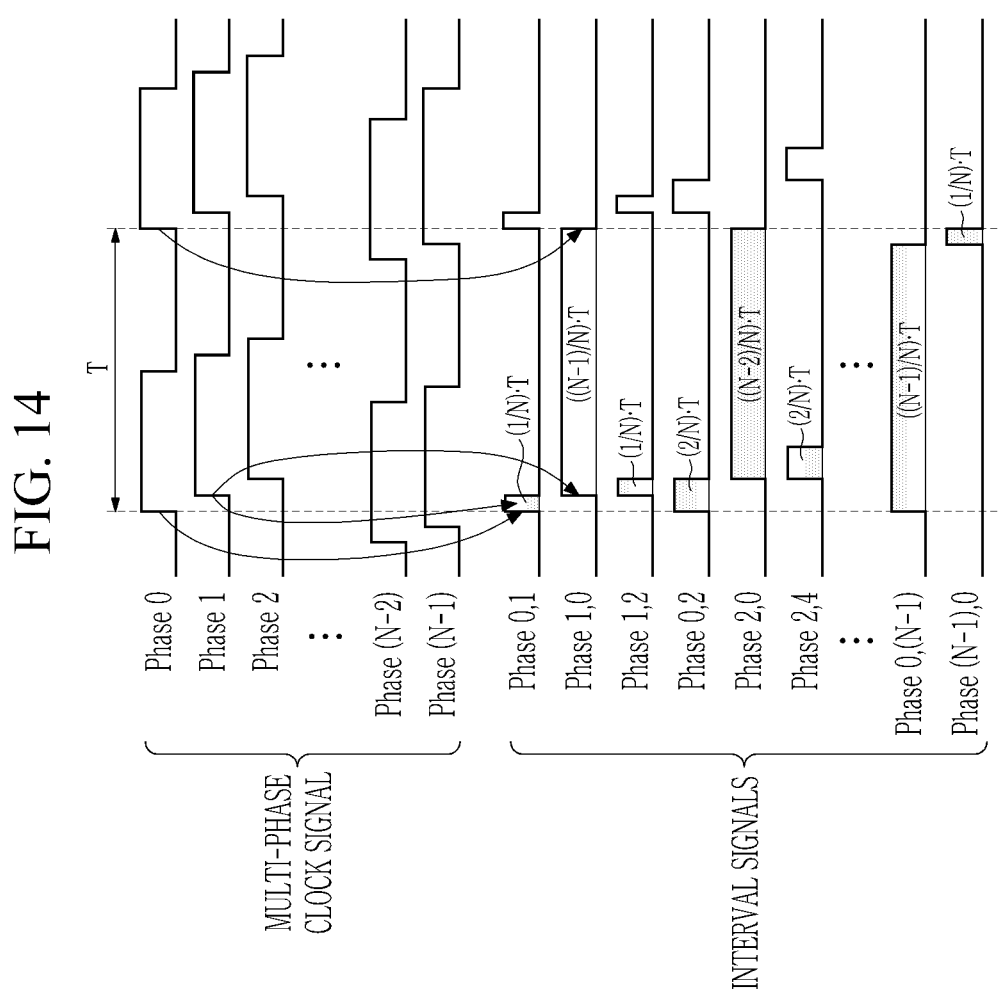
FIG. 14 is a diagram for describing a plurality of interval signals generated by an error corrector according to an embodiment.

FIG. 14 is a diagram for describing a plurality of interval signals generated by an error corrector according to an embodiment. Referring to FIG. 14, the error corrector may receive a multi-phase clock signal. The multi-phase clock signal may include a plurality of phase signals Phase 0 to N−1. The error corrector may generate a plurality of interval signals based on a multi-phase clock signal. The error corrector may detect errors in the multi-phase clock signal based on the plurality of interval signals.

The error corrector generating a plurality of interval signals from a multi-phase clock signal is an extension to N (N is an integer greater than 2), compared to generating a plurality of interval signals from the first quadrature clock signal in FIG. 4. The period of the multi-phase clock signal is T. The multi-phase clock signal has a phase difference of T/N from adjacent phase signals. The error corrector may generate two interval signals with the same interval (e.g., pulse width). The error corrector may detect errors in the multi-phase clock signal based on the two interval signals.

The sum of a first interval $(1/N)*T$ of the first edge trigger signal Phase 0,1 and a second interval $(N−1)/N)*T$ of the second edge trigger signal Phase 1,0 is the period T of the multi-phase clock signal. The sum of a third interval $(2/N)*T$ of the third edge trigger signal Phase 0,2 and the second interval $(N−2)/N)*T$ of the fourth edge trigger signal Phase 2,0 is the period T of the multi-phase clock signal. Similarly, the sum of a 2N−1 interval $(((N−1)/N)*T$ error)) of a 2N−1 edge trigger signal Phase 0,N−1 and a 2N interval $((1/N)*T−error)$ of a 2N edge trigger signal Phase N−1,0 is the period T of the multi-phase clock signal.

The error corrector may generate an edge trigger signal Phase 1,2 having a period corresponding to the first period $(1/N)*T$ of the first edge trigger signal Phase 0,1. The edge trigger signal Phase 1,2 may have the interval $(1/N)*T$ from the edge of the phase signal Phase 1 to the edge of the phase signal Phase 2. The error corrector may detect an error in the phase signal Phase 1 based on the edge trigger signal Phase 0,1 and the edge trigger signal Phase 1,2.

Additionally, the error corrector may generate an edge trigger signal Phase 2,4 having a period corresponding to the third period $(2/N)*T$ of the third edge trigger signal Phase 0,2. The edge trigger signal Phase 2,4 may have the interval $(2/N)*T$ from the edge of the phase signal Phase 2 to the edge of the phase signal Phase 4. The error corrector may detect an error in the phase signal Phase 2 based on the edge trigger signal Phase 0.2 and the edge trigger signal Phase 2,4.

As such, the error corrector may detect and correct errors in a multi-phase clock signal based on a plurality of interval signals.

Figure 15:
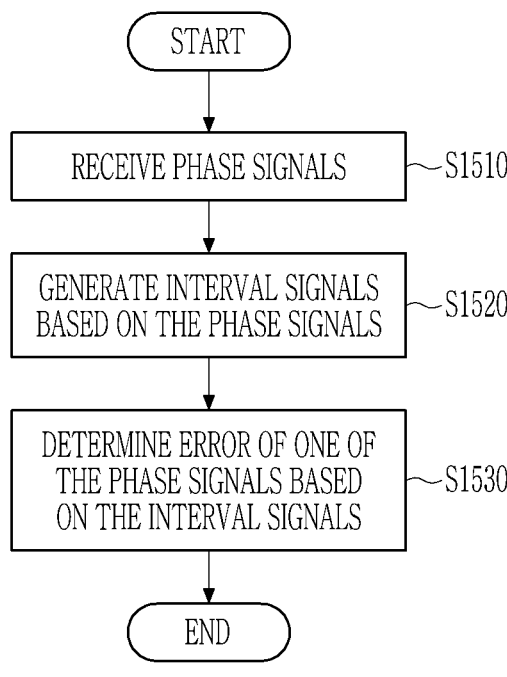
FIG. 15 is a flowchart of an error detecting method according to an embodiment.

FIG. 15 is a flowchart of an error detecting method according to an embodiment. Referring to FIG. 15, an error detector according to an embodiment may detect an error in a multi-phase clock signal. The error detector may receive a plurality of phase signals (S1510). In an embodiment, the plurality of phase signals may be quadrature clock signals. The quadrature clock signal may include the in-phase signal, the quadrature signal, the inverted in-phase signal, and the inverted quadrature signal. At least one of the quadrature signal, the inverted in-phase signal, and the inverted quadrature signal may include an error based on the in-phase signal.

The error detector may generate a plurality of interval signals based on a plurality of phase signals (S1520). The plurality of interval signals may include the interval between edges of two phase signals among the plurality of phase signals. For example, the first interval signal among the plurality of interval signals may have a pulse width from the edge of the first phase signal to the edge of the second phase signal among the plurality of phase signals. The first interval signal may have a rising edge at a time point corresponding to the rising edge of the first phase signal, and may have a falling edge at a time point corresponding to the rising edge of the second phase signal. The second interval signal among the plurality of interval signals may have a pulse width from the edge of the second phase signal to the edge of the third phase signal among the plurality of phase signals. The second interval signal may have a rising edge at a time point corresponding to the rising edge of the second phase signal, and may have a falling edge at a time point corresponding to the rising edge of the third phase signal. That is, the second interval signal may have the same period or duration as the first interval signal.

The error detector may determine the error in one of the plurality of phase signals (e.g., the second phase signal) based on the first interval signal and the second interval signal having the same interval among the plurality of interval signals (S1530). For example, the error detector may obtain a first voltage value corresponding to the first interval signal, and obtain a second voltage value corresponding to the second interval signal. The error detector may obtain the first voltage value and the second voltage value using a low-pass filter. The error detector may detect an error by comparing the first voltage value and the second voltage value.

The error detector may output an error value to an error corrector. The error corrector may correct an error in the second phase signal based on the error value. For example, the error corrector may adjust at least one of the duty ratio and phase of the second phase signal using a delay cell.

Figure 16:
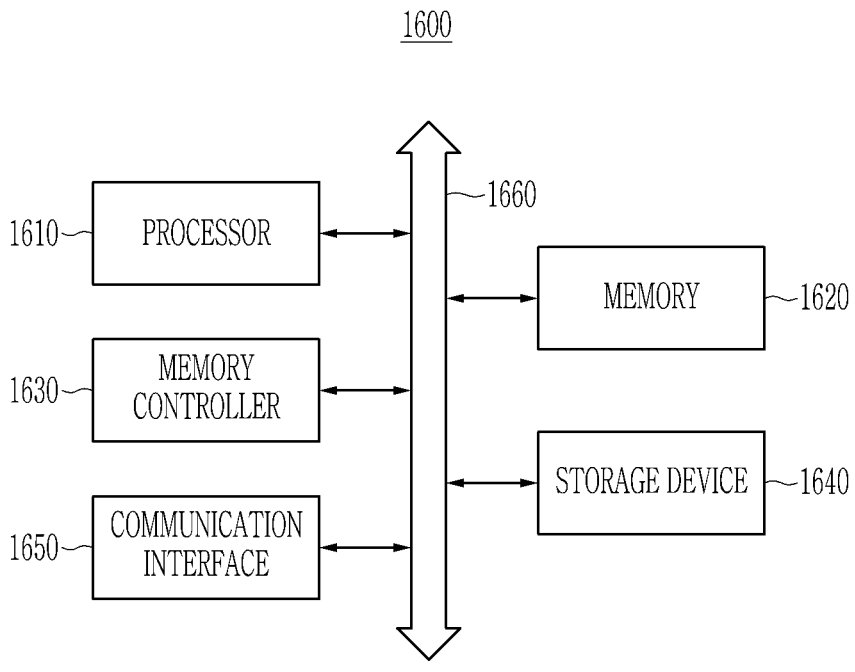
FIG. 16 is a block diagram of a computing system according to an embodiment.

FIG. 16 is a block diagram of a computing system 1600 according to an embodiment. Referring to FIG. 16, the computing system includes a processor 1610, a memory 1620, a memory controller 1630, a storage device 1640, a communication interface 1650, and a bus 1660. The computing system 1600 may further include other general-purpose constituent elements. The processor 1610 controls the overall operation of each component of the computing system 1600. The processor 1610 may be implemented as at least one of various processing units, such as a central processing unit (CPU), an application processor (AP), or a graphic processing unit (GPU).

The memory 1620 stores various data and instructions. The memory controller 1630 controls the transfer of data or instructions to and from the memory 1620. The memory 1620 and/or the memory controller 1630 may operate using the clock signals described with reference to FIGS. 1 to 15. The memory 1620 and/or the memory controller 1630 may include an error detector detecting errors in the multi-phase clock signal and an error corrector correcting the errors. The error detector may generate a plurality of interval signals based on the multi-phase clock signal, and detect errors in the multi-phase clock signal based on the plurality of interval signals. In some embodiments, the memory controller 1630 may be provided as a separate chip from the processor 1610. In some embodiments, the memory controller 1630 may be provided as an internal component of the processor 1610.

The storage device 1640 non-temporarily stores programs and data. In some embodiments, the storage device 1640 may be implemented as non-volatile memory. The communication interface 1650 supports wired and wireless Internet communication of the computing system 1600. Additionally, the communication interface 1650 may support various communication methods other than Internet communication. The bus 1660 provides communication functionality between constituent elements of the computing system 1600. The bus 1660 may include at least one type of bus depending on the communication protocol constituent elements.

Figure 17:
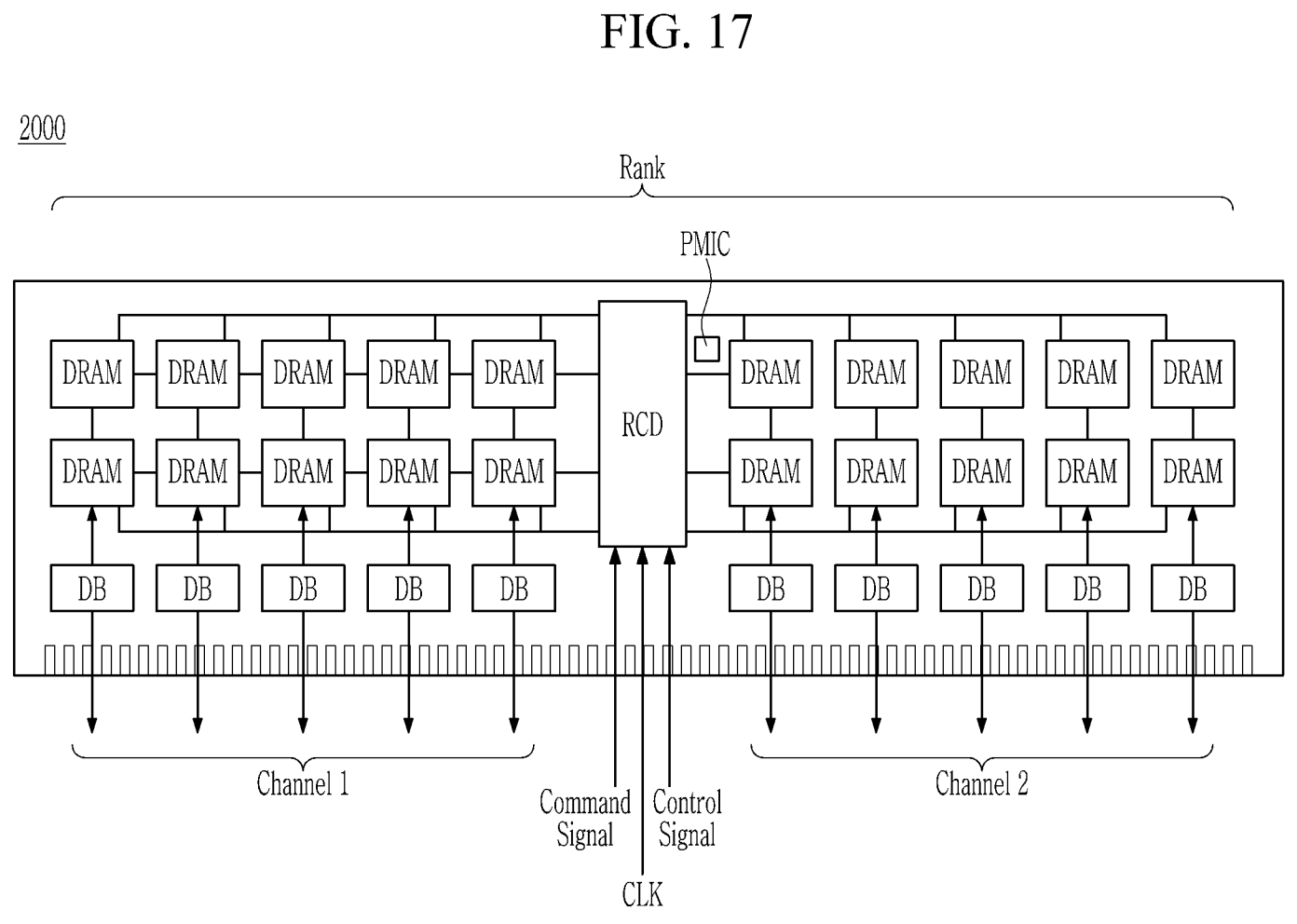

FIG. 17 is a diagram illustrating a memory module 2000 according to an embodiment. Referring to FIG. 17, the memory module 2000 may include a plurality of memory chips DRAM each including a memory cell array, a memory controller, a buffer chip RCD for routing signals to and from the memory chips and/or managing memory operations for the memory chips, and a power management chip PMIC.

The RCD may control the memory chips DRAM and the power management chip PMIC according to the control of the memory controller. For example, the RCD may receive a command signal, a control signal, and a clock signal CLK from the memory controller. The memory chips DRAM may transmit and receive data signals DQ and data strobe signals DQS through corresponding data transmission lines connected to the corresponding data buffers DB. Each of the memory chips DRAM may be connected to the data buffer DB through corresponding data transmission lines, and transmit and receive parity data and the data strobe signals DQS.

The memory module 2000 may include a programmable read-only memory (EEPROM). The EEPROM may include initial information or device information of the memory module 2000. For example, the EEPROM may include initial information or device information such as module type, module configuration, storage capacity, module type, execution environment, etc. of the memory module 2000. When the memory system including the memory module 2000 is booted, the memory controller may read device information from the EEPROM and recognize the memory module based on the read device information.

The memory module 2000 may include a plurality of ranks. In an embodiment, each rank may include eight bank groups. Each bank group may include four banks. In embodiments, the memory chips may be divided into first channel-only memory chips and second channel-only memory chips. Meanwhile, each of the plurality of ranks may include an error detector detecting errors in the multi-phase clock signal and an error corrector correcting the errors, as described in FIGS. 1 to 15. The error detector may generate a plurality of interval signals based on the multi-phase clock signal and detect errors in the multi-phase clock signal based on the plurality of interval signals.

Figure 18:
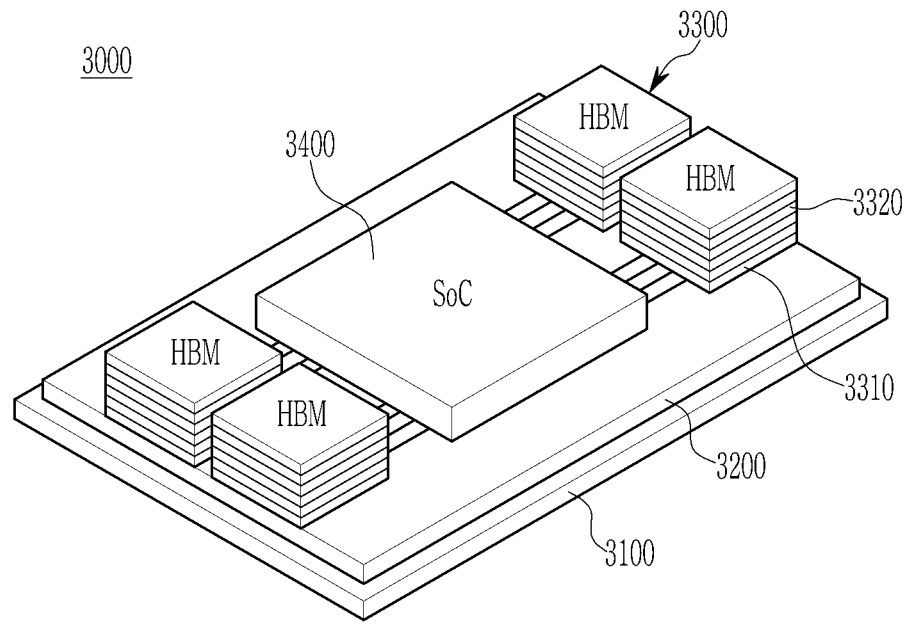
FIG. 18 is a diagram illustrating a semiconductor package according to an embodiment.

FIG. 18 is a diagram illustrating a semiconductor package 3000 according to an embodiment. Referring to FIG. 18, the semiconductor package 3000 may be a memory module including at least one stack semiconductor chip 3300 and a system on chip (SoC) 3400 mounted on a package substrate 3100, such as a printed circuit board. An interposer 3200 may be optionally further provided on the package substrate 3100. The stack semiconductor chip 3300 may be formed as a chip on chip (CoC). As described in FIGS. 1 to 15, the stack semiconductor chip 3300 may include an error detector detecting errors in the multi-phase clock signal and an error corrector correcting the errors. The error detector may generate a plurality of interval signals based on the multi-phase clock signal and detect errors in the multi-phase clock signal based on the plurality of interval signals.

The stack semiconductor chip 3300 may include at least one memory chip 3320 stacked on a buffer chip 3310 such as a logic chip. The buffer chip 3310 and at least one memory chip 3320 may be connected to each other through a through silicon via (TSV). The buffer chip 3310 may perform a training operation on the memory chip 3320. For example, the stack semiconductor chip 3300 may be a high bandwidth memory (HBM) of 500 GB/sec to 1 TB/sec or more.

In some embodiments, each constituent element or combination of two or more constituent elements described with reference to FIGS. 1 to 18 may be a digital circuit, a programmable or non-programmable logic device or array, or an application specific integrated circuit (ASIC), and the like.

While the embodiments of the present disclosure have been described in detail, it is to be understood that the disclosure is not limited to the disclosed embodiments, but on the contrary, is intended to cover various modifications and equivalent arrangements included within the spirit and scope of the appended claims.

What is claimed is:

1. An error detector for a memory device, comprising:
a first pulse generator configured to generate a first interval signal and a second interval signal based on a plurality of phase signals;
a first low-pass filter configured to convert the first interval signal into a first voltage and the second interval signal to a second voltage; and
a first comparator configured to determine an error in a first phase signal among the plurality of phase signals, based on the first voltage and the second voltage, wherein:
the first and second interval signals have equivalent duty cycles;
the plurality of phase signals include an in-phase signal and an inverted in-phase signal; and
the first pulse generator is configured to generate the first interval signal such that a rising edge of the in-phase signal corresponds to a rising edge of the first interval signal, and a rising edge of the inverted in-phase signal corresponds to a falling edge of the first interval signal.

2. The error detector of claim 1, wherein the first pulse generator is configured to generate the first interval signal based on the first phase signal and a second phase signal among the plurality of phase signals, and generate the second interval signal based on the first phase signal and a third phase signal among the plurality of phase signals.

3. The error detector of claim 2,
wherein a phase of the first phase signal lags behind a phase of the second phase signal, and
wherein a phase of the first phase signal leads a phase of the third phase signal.

4. The error detector of claim 1,
wherein the plurality of phase signals are quadrature clock signals including a quadrature signal and an inverted quadrature signal;
wherein the first pulse generator is configured to generate the second interval signal such that a rising edge of the inverted in-phase signal and a rising edge of the in-phase signal correspond to a rising edge and a falling edge of the second interval signals, respectively; and
wherein the first comparator is configured to determine an error in the inverted in-phase signal, based on the first voltage and the second voltage.

5. The error detector of claim 4, further comprising:
a second pulse generator configured to generate a third interval signal and a fourth interval signal having equivalent duty cycles, in response to the in-phase signal, the quadrature signal, the inverted quadrature signal, and the inverted in-phase signal;
a second low-pass filter configured to convert the third interval signal into a third voltage and a fourth interval signal into a fourth voltage; and
a second comparator configured to determine an error in a second phase signal among the plurality of phase signals, in response to the third and fourth voltages.

6. The error detector of claim 5,
wherein the second pulse generator is configured to generate the third interval signal such that a rising edge of the in-phase signal and a rising edge of the quadrature signal correspond to a rising edge and a falling edge of the third interval signal, respectively, and generate the fourth interval signal such that a rising edge of the quadrature signal and a rising edge of the inverted in-phase signal correspond to a rising edge and a falling edge of the fourth interval signal, respectively; and
wherein the second comparator is configured to determine an error in the quadrature signal, based on the third voltage and the fourth voltage.

7. The error detector of claim 5,
wherein the second pulse generator is configured to generate the third interval signal such that a rising edge of the inverted in-phase signal and a rising edge of the inverted quadrature signal correspond to a rising edge and a falling edge of the third interval signal, respectively, and generate the fourth interval signal such that a rising edge of the inverted quadrature signal and a rising edge of the in-phase signal corresponding to a rising edge and a falling edge of the fourth interval signals, respectively; and
wherein the second comparator is configured to determine an error in the inverted quadrature signal, based on the third voltage and the fourth voltage.

8. The error detector of claim 4, further comprising:
a second pulse generator configured to generate third and fourth interval signals having equivalent duty cycles, in response to the plurality of phase signals;
a second low-pass filter configured to convert the third and fourth interval signals into respective third and fourth voltages; and a second comparator configured to determine an error in a second phase signal among the plurality of phase signals, in response to the third and fourth voltages.

9. The error detector of claim 1, wherein the first pulse generator includes a plurality of switches configured to control one or more paths of the plurality of phase signals by opening and closing the plurality of switches based on a selection signal, and is configured to generate the first interval signal and the second interval signal in response to the opening and closing of the plurality of switches.

10. A memory device, comprising:
  a first error detector configured to generate a first interval signal and a second interval signal having a duty cycle of a first period based on a first quadrature clock signal, and detect a first error in a first inverted in-phase signal of the first quadrature clock signal based on the first interval signal and the second interval signal;
  a second error detector configured to generate a third interval signal and a fourth interval signal having a duty cycle of a second period based on the first quadrature clock signal, and detect a second error in a first quadrature signal of the first quadrature clock signal based on the third interval signal and the fourth interval signal;
  a third error detector configured to generate a fifth interval signal and a sixth interval signal having a duty cycle of a third period based on the first quadrature clock signal, and detect a third error in a first inverted quadrature signal of the first quadrature clock signal based on the fifth interval signal and the sixth interval signal;
  a delay cell configured to generate a second inverted in-phase signal by delaying the first inverted in-phase signal based on the first error, generate a second quadrature signal by delaying the first quadrature signal based on the second error, and generate a second inverted quadrature signal by delaying the first inverted quadrature signal based on the third error; and
  a memory chip configured to perform a memory operation based on the second inverted in-phase signal, the second quadrature signal, the second inverted quadrature signal, and the first quadrature clock signal.

11. The memory device of claim 10, wherein the second error detector is configured to generate the third interval signal and the fourth interval signal based on the second inverted in-phase signal, the first in-phase signal, the first quadrature signal, and the first inverted quadrature signal.

12. The memory device of claim 10, wherein the third error detector is configured to generate the fifth interval signal and the sixth interval signal based on the second inverted in-phase signal, the first in-phase signal, the first quadrature signal, and the first inverted quadrature signal.

13. The memory device of claim 10, wherein the period of the first quadrature clock signal is T; wherein the first period corresponds to (2/4)*T; and wherein the second period and the third period correspond to (1/4)*T.

14. The memory device of claim 10, wherein the second error detector is configured to generate the third interval signal based on the first in-phase signal and the first quadrature signal, and configured to generate the fourth interval signal based on the first quadrature signal, the first inverted in-phase signal, and the first inverted quadrature signal.

15. The memory device of claim 10, wherein the third error detector is configured to generate the fifth interval signal based on the first in-phase signal, the first quadrature signal, and the first inverted in-phase signal, and configured to generate the sixth interval signal based on the first in-phase signal and the first inverted quadrature signal.

16. An error detecting method for a memory device, comprising:
  receiving a plurality of phase signals;
  generating a plurality of interval signals including a first interval signal and a second interval signal having equivalent duty cycles based on the plurality of phase signals; and
  determining an error in any one of the plurality of phase signals based on the first interval signal and the second interval signal among the plurality of interval signals,
  wherein said generating of the first interval signal includes generating the first interval signal having a rising edge corresponding to a rising edge of a first phase signal and a falling edge corresponding to a rising edge of a second phase signal.

17. The error detecting method of claim 16, wherein said generating of the plurality of interval signals includes:
  generating the first interval signal based on the first phase signal and the second phase signal among the plurality of phase signals; and
  generating the second interval signal based on the second phase signal and a third phase signal among the plurality of phase signals.

18. The error detecting method of claim 17, wherein said generating of the second interval signal includes generating the second interval signal having a rising edge corresponding to a rising edge of the second phase signal and a falling edge corresponding to a rising edge of the third phase signal.

19. The error detecting method of claim 17, wherein the plurality of interval signals include N phase signals with a period of T; wherein the second phase signal has a phase lagging behind the phase of the first phase signal by T/N; wherein the third phase signal has a phase lagging behind the phase of the second phase signal by T/N; and wherein N is an integer greater than 1.

20. The error detecting method of claim 17, wherein said determining of the error in any one of the plurality of phase signals includes determining an error in the second phase signal based on the first interval signal and the second interval signal.

* * * * *